United States Patent
Yamada

(10) Patent No.: US 9,178,470 B2
(45) Date of Patent: Nov. 3, 2015

(54) RESONATOR ELEMENT, RESONATOR, OSCILLATOR, ELECTRONIC DEVICE, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 14/335,217

(22) Filed: Jul. 18, 2014

(65) Prior Publication Data

US 2015/0022276 A1 Jan. 22, 2015

(30) Foreign Application Priority Data

Jul. 18, 2013 (JP) ................. 2013-149982

(51) Int. Cl.
*G04F 5/06* (2006.01)
*H01L 41/04* (2006.01)
*H03B 5/32* (2006.01)
*H03H 9/215* (2006.01)
*H03B 5/30* (2006.01)
(Continued)

(52) U.S. Cl.
CPC ...... *H03B 5/30* (2013.01); *G04F 5/063* (2013.01); *H01L 41/04* (2013.01); *H03B 5/32* (2013.01); *H03H 9/0547* (2013.01); *H03H 9/1014* (2013.01); *H03H 9/215* (2013.01)

(58) Field of Classification Search
CPC ............. G04F 5/04; G04F 5/06; G04F 5/063; H01L 41/00; H01L 41/02; H01L 41/04; H01L 41/053; H01L 41/08; H01L 41/09; H03B 5/30; H03B 5/32; H03H 9/15; H03H 9/17; H03H 9/19; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
USPC .......... 310/311, 312, 348, 370; 331/154, 156, 331/158
See application file for complete search history.

(56) References Cited

U.S. PATENT DOCUMENTS

| | | | | |
|---|---|---|---|---|
| 5,408,876 A | * | 4/1995 | Macy | ............... 73/504.16 |
| 7,067,966 B2 | * | 6/2006 | Tanaya | ............... 310/367 |
| 7,456,555 B2 | * | 11/2008 | Matsudo et al. | ......... 310/370 |

(Continued)

FOREIGN PATENT DOCUMENTS

| | | |
|---|---|---|
| JP | A-2007-201936 | 8/2007 |
| JP | A-2010-283804 | 12/2010 |

(Continued)

*Primary Examiner* — Levi Gannon
(74) *Attorney, Agent, or Firm* — Oliff PLC

(57) ABSTRACT

A resonator element is provided. A base portion includes a first base portion, a second base portion, and a connecting portion. The base portion includes a width-decreasing portion that is provided at an end of the connecting portion on the first base portion side and that has a width along an X-axis direction which continuously decreases toward the second base portion. An outer edge of the width-decreasing portion and an outer edge of the connecting portion form a continuous line that does not include a corner portion, when seen in a plan view. When an angle between a tangent of a portion of the curved line on the first base portion side and a segment parallel to the X-axis direction is set to θ, a relation of 0°<θ<90° is satisfied.

21 Claims, 17 Drawing Sheets

(51) Int. Cl.
*H03H 9/05* (2006.01)
*H03H 9/10* (2006.01)

(56) References Cited

U.S. PATENT DOCUMENTS

| | | | |
|---|---|---|---|
| 8,928,422 B2* | 1/2015 | Yamada et al. | 331/158 |
| 2003/0197566 A1* | 10/2003 | Kawashima | 331/156 |
| 2005/0000934 A1* | 1/2005 | Nakatani et al. | 216/13 |
| 2007/0188055 A1 | 8/2007 | Kuwahara | |
| 2007/0222342 A1* | 9/2007 | Hokibara et al. | 310/370 |
| 2008/0297008 A1* | 12/2008 | Yamada et al. | 310/370 |
| 2011/0068876 A1* | 3/2011 | Yamada et al. | 331/158 |
| 2011/0187470 A1* | 8/2011 | Yamada | 331/155 |
| 2011/0204985 A1* | 8/2011 | Yamada et al. | 331/156 |
| 2011/0227672 A1 | 9/2011 | Yamada | |
| 2011/0305120 A1* | 12/2011 | Hessler et al. | 368/159 |
| 2013/0082576 A1 | 4/2013 | Arimatsu | |
| 2013/0082792 A1 | 4/2013 | Arimatsu | |
| 2013/0208573 A1* | 8/2013 | Arimatsu | 368/47 |

FOREIGN PATENT DOCUMENTS

| | | |
|---|---|---|
| JP | A-2011-176665 | 9/2011 |
| JP | A-2011-199331 | 10/2011 |
| JP | A-2011-223229 | 11/2011 |
| JP | A-2011-239132 | 11/2011 |
| JP | A-2011-239133 | 11/2011 |
| JP | A-2012-119949 | 6/2012 |
| JP | A-2012-129904 | 7/2012 |
| JP | A-2013-078079 | 4/2013 |
| JP | A-2013-078081 | 4/2013 |
| JP | A-2013-165455 | 8/2013 |
| JP | A-2013-229733 | 11/2013 |

* cited by examiner

RESONATOR ELEMENT, RESONATOR, OSCILLATOR, ELECTRONIC DEVICE, AND MOVING OBJECT

CROSS REFERENCE

The entire disclose of Japanese Patent Application No. 2013-149982 filed Jul. 18, 2013 is expressly incorporated by reference herein.

BACKGROUND

1. Technical Field

The present invention relates to a resonator element, a resonator, an oscillator, an electronic device, and a moving object.

2. Related Art

A so-called two-legged tuning fork type quartz crystal resonator is known as a resonator (for example, refer to JP-A-2011-223229). For example, as disclosed in JP-A-2011-223229, a resonator element included in the resonator includes a base portion and two vibrating arms extending from the base portion so as to be parallel to each other, and flexurally vibrates the two vibrating arms in an in-plane direction so that the arms alternately repeat mutual approach and separation.

A resonator element according to JP-A-2011-176665 includes a notch portion formed by notching the base portion along a direction in which vibrating arms are lined up. In order to solve a problem in that stress is likely to concentrate due to a sharp wedge-shaped point formed in a distal end of the base portion of the notch portion on the center side by over-etching at the time of formation of the notch portion using wet etching, an inclination portion is provided on the opening side of the notch portion in a direction in which the vibrating arms are lined up so that the notch portion has a shape in which a width along an extension direction of the vibrating arms increases toward the opening side. Thus, over-etching is suppressed, and the sharp wedge-shaped point is not formed in the distal end, thereby increasing impact resistance.

However, according to the resonator element disclosed in JP-A-2011-176665, in an outer edge of the notch portion on the vibrating arm side when seen in a plan view, a junction between a curved line 12 and a straight line 12a has a corner portion A having a discontinuous curvature. Thus, there is a problem in that stress is likely to concentrate on the corner portion A and it is not possible to sufficiently increase impact resistance.

SUMMARY

An advantage of some aspects of the invention is to provide a resonator element capable of reducing stress concentrating on a notch portion, and a resonator, an oscillator, an electronic device, and a moving object which include the resonator element.

The invention can be implemented as the following forms or application examples.

APPLICATION EXAMPLE 1

This application example is directed to a resonator element including a base portion; and a pair of vibrating arms that extend along a first direction from one end of the base portion and are lined up along a second direction crossing the first direction. The base portion includes a first base portion that includes the one end, a second base portion that is provided on the opposite side to the one end side of the first base portion when seen in a plan view, and a connecting portion that connects the first base portion and the second base portion. The base portion is provided with a notch portion that is lined up with the connecting portion along the second direction and that has a width along the first direction which increases toward the outside. In a principal surface of the base portion, one end-side outer edge of the notch portion on the one end side and the other end-side outer edge of the notch portion on the other end side, which is the opposite side to the one end, are asymmetrical with respect to a first virtual line along the second direction which passes through the notch portion, and in the one end-side outer edge, an outer edge, which passes through a center of a width of the notch portion along the second direction and is on a central side of the connecting portion with respect to the first virtual line along the first direction, is a line that does not include a corner portion. When an angle between a tangent of the outer edge and the first virtual line is set to θ, a relation of $0°<θ<90°$ is satisfied.

According to the resonator element, the base portion includes the first base portion, the second base portion, and the connecting portion. Thus, it is possible to reduce vibration leakage while reducing the length of the base portion along the first direction.

In particular, the base portion includes a width-decreasing portion, and thus it is possible to effectively reduce the deformation of the first base portion which is associated with flexural vibration of the pair of vibrating arms that alternately repeat mutual approach and separation in the same plane. As a result, even when the length of the first base portion along the first direction is reduced, it is possible to suppress the deformation of the first base portion which is associated with the flexural vibration of the pair of vibrating arms that alternately repeat mutual approach and separation substantially in a plane, and to reduce vibration leakage to the outside from the base portion.

Further, the shapes of the first base portion and the outer edge of the connecting portion, when seen in a plan view, are optimized, and thus it is possible to reduce stress occurring in the base portion and to reduce thermoelastic loss.

Thus, the resonator element of the invention can increase impact resistance and a Q value.

APPLICATION EXAMPLE 2

In the resonator element according to the application example described above, it is preferable that a relation of $6°≤θ≤70°$ is satisfied.

Thus, it is possible to reduce stress occurring in the base portion and to more effectively reduce thermoelastic loss.

APPLICATION EXAMPLE 3

In the resonator element according to the application example described above, it is preferable that, when a width of the first base portion along the second direction is set to S1 and a minimum width of the connecting portion along the second direction is set to S2, S2/S1 is equal to or greater than 0.3 and equal to or less than 0.6.

Thus, it is possible to efficiently reduce vibration leakage while reducing the length of the base portion along the first direction.

APPLICATION EXAMPLE 4

In the resonator element according to the application example described above, it is preferable that the vibrating arm includes a weight portion and an arm portion which is disposed between the base portion and the weight portion, when seen in a plan view.

Thus, it is possible to achieve a reduction in size without increasing the lengths of the vibrating arms.

APPLICATION EXAMPLE 5

In the resonator element according to the application example described above, it is preferable that the weight portion has a width along the second direction which is larger than that of the arm portion.

Thus, it is possible to increase the strength of the vibrating arms by increasing the widths of the arm portions of the vibrating arms, and to increase a Q value by reducing thermoelastic loss. As a result, it is possible to increase impact resistance while achieving a reduction in size, and to decrease a crystal impedance (CI) value.

APPLICATION EXAMPLE 6

In the resonator element according to the application example described above, it is preferable that, when a width of the arm portion along the second direction is set to W1 and a width of the weight portion along the second direction is set to W2, W2/W1 is equal to or greater than 1.43 and equal to or less than 1.79.

Thus, it is possible to more efficiently increase a Q value and the strength of the vibrating arms without increasing the lengths of the vibrating arms.

APPLICATION EXAMPLE 7

In the resonator element according to the application example described above, it is preferable that a groove is provided along the first direction in at least one principal surface of a first principal surface and a second principal surface of the vibrating arm which serve as front and back sides, respectively.

Thus, it is possible to reduce thermoelastic loss.

APPLICATION EXAMPLE 8

In the resonator element according to the application example described above, it is preferable that, in the principal surface provided with the groove, when a width of the arm portion along the second direction is set to W1, a width, along the second direction, of a portion interposed between a side surface, which connects the first principal surface and the second principal surface, and an outer edge of the groove lined up with the side surface along the second direction is set to W3, and $2 \times W3/W1$ is set to $\eta$, a relation of $20\% \leq \eta \leq 50\%$ is satisfied.

Thus, it is possible to efficiently increase a Q value and the strength of the vibrating arms.

APPLICATION EXAMPLE 9

In the resonator element according to the application example described above, it is preferable that a relation of $30\% \leq \eta \leq 40\%$ is satisfied.

Thus, it is possible to more efficiently increase a Q value and the strength of the vibrating arms.

APPLICATION EXAMPLE 10

In the resonator element according to the application example described above, it is preferable that a thickness of the arm portion is equal to or greater than 115 μm and equal to or less than 150 μm.

Accordingly, the arm portions of the vibrating arms become relatively thicker, and thus it is possible to increase the strength of the vibrating arms. In addition, since it is possible to secure large areas of the vibrating arms to which an electric field is applied by the relatively large thicknesses of the arm portions of the vibrating arms, it is possible to increase electric field efficiency. Thus, it is possible to decrease a CI value.

APPLICATION EXAMPLE 11

In the resonator element according to the application example described above, it is preferable that the resonator element further includes an excitation electrode provided in the vibrating arm, the excitation electrode includes a base layer and a covering layer which is laminated on the base layer on the opposite side to the vibrating arm, and when a thickness of the base layer is set to Tb and a thickness of the covering layer is set to Tc, a relation of $Tb/Tc \leq 4/7$ is satisfied.

Thus, even when the base layer has a phase transition point on the low-temperature side in an operation temperature range, it is possible to decrease a CI value on the low-temperature side in the operation temperature range.

APPLICATION EXAMPLE 12

In the resonator element according to the application example described above, it is preferable that the base layer is formed of chromium, and a thickness of the base layer is equal to or greater than 50 Å and equal to or less than 700 Å.

In spite of having an excellent function as a base layer, chromium has a phase transition point at a relatively low temperature. Consequently, the thickness of the base layer formed of chromium is reduced to approximately equal to or greater than 50 Å and equal to or less than 700 Å, and thus it is possible to suppress an increase in a CI value due to the phase transition of chromium of the base layer in a low temperature region while achieving a function as the base layer.

APPLICATION EXAMPLE 13

This application example is directed to a resonator including the resonator element of the application example and a package that accommodates the resonator element.

Thus, it is possible to provide the resonator having an excellent reliability.

APPLICATION EXAMPLE 14

This application example is directed to an oscillator including the resonator element of the application example and a circuit.

Thus, it is possible to provide the oscillator having an excellent reliability.

APPLICATION EXAMPLE 15

This application example is directed to an electronic device including the resonator element of the application example.

Thus, it is possible to provide the electronic device having an excellent reliability.

APPLICATION EXAMPLE 16

This application example is directed to a moving object including the resonator element of the application example.

Thus, it is possible to provide the moving object having an excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a resonator element, a resonator, an oscillator, an electronic device, and a moving object according to the invention will be described in detail with reference to preferred embodiments shown in the diagrams.

1. Resonator

First, the resonator according to the invention (resonator including the resonator element according to the invention) will be described.

First Embodiment

Figure 1:
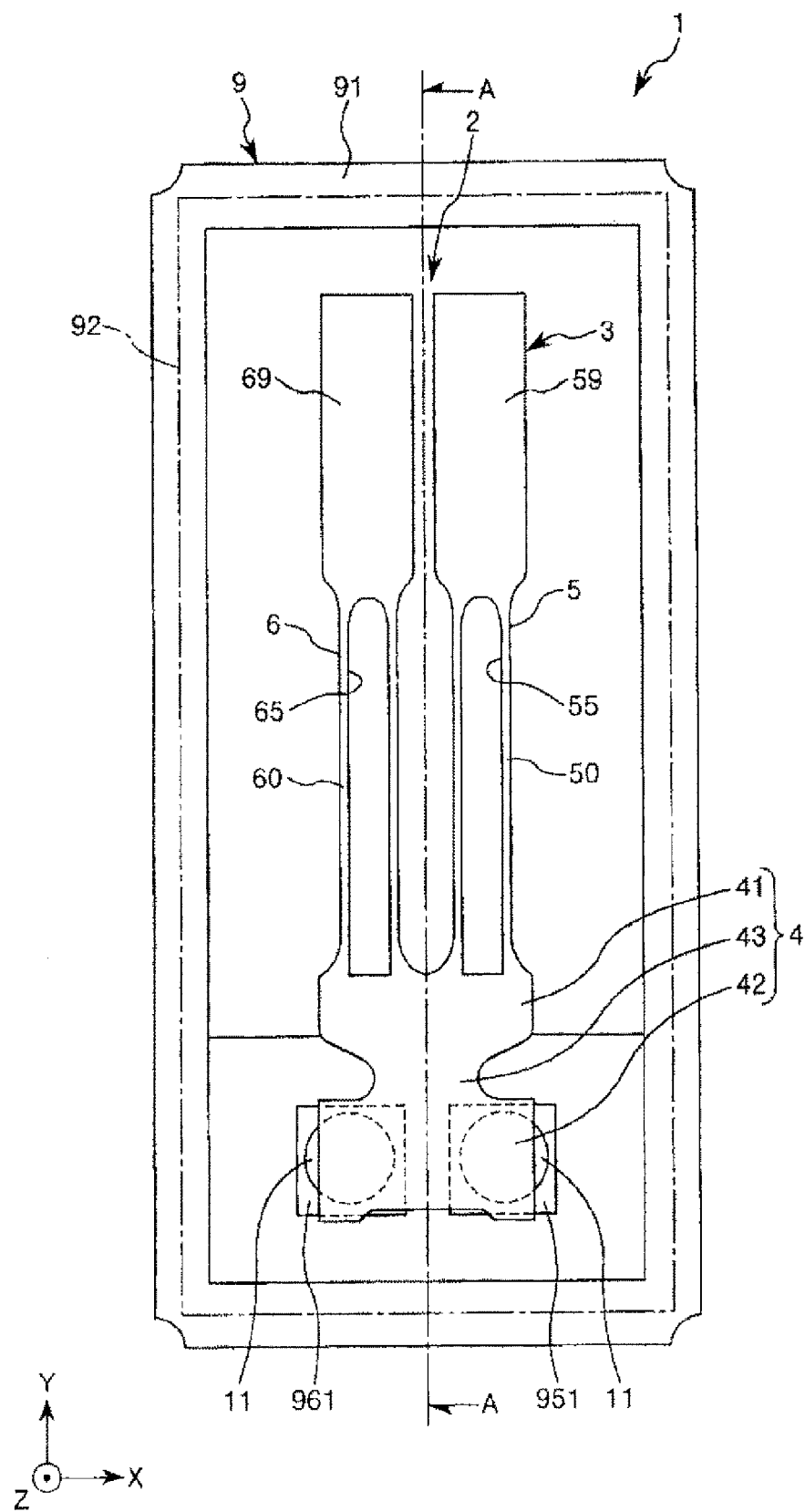
FIG. 1 is a plan view showing a resonator according to an embodiment of the invention.
Figure 2:
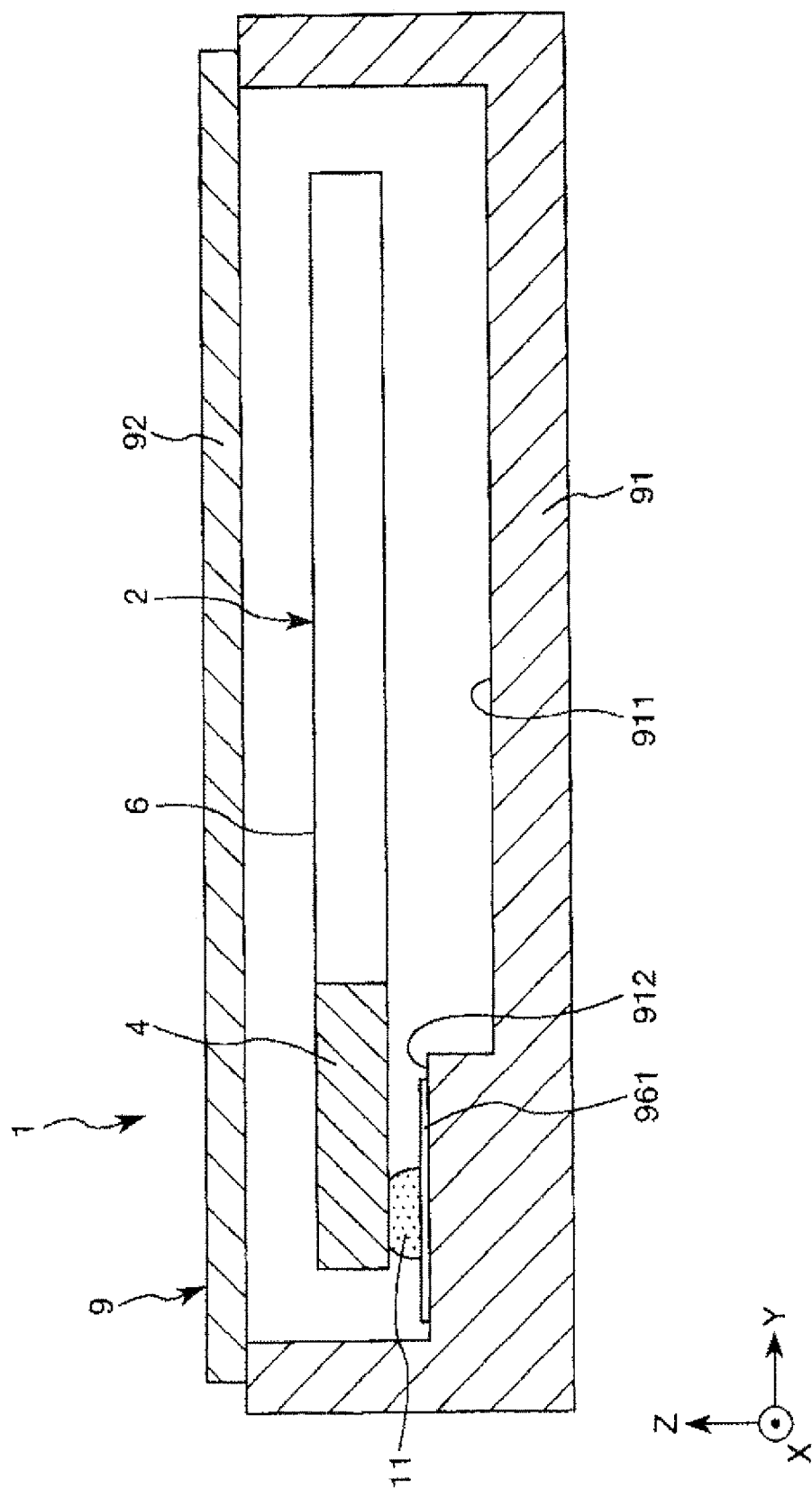
FIG. 2 is a cross-sectional view taken along line A-A of FIG. 1.
Figure 3:
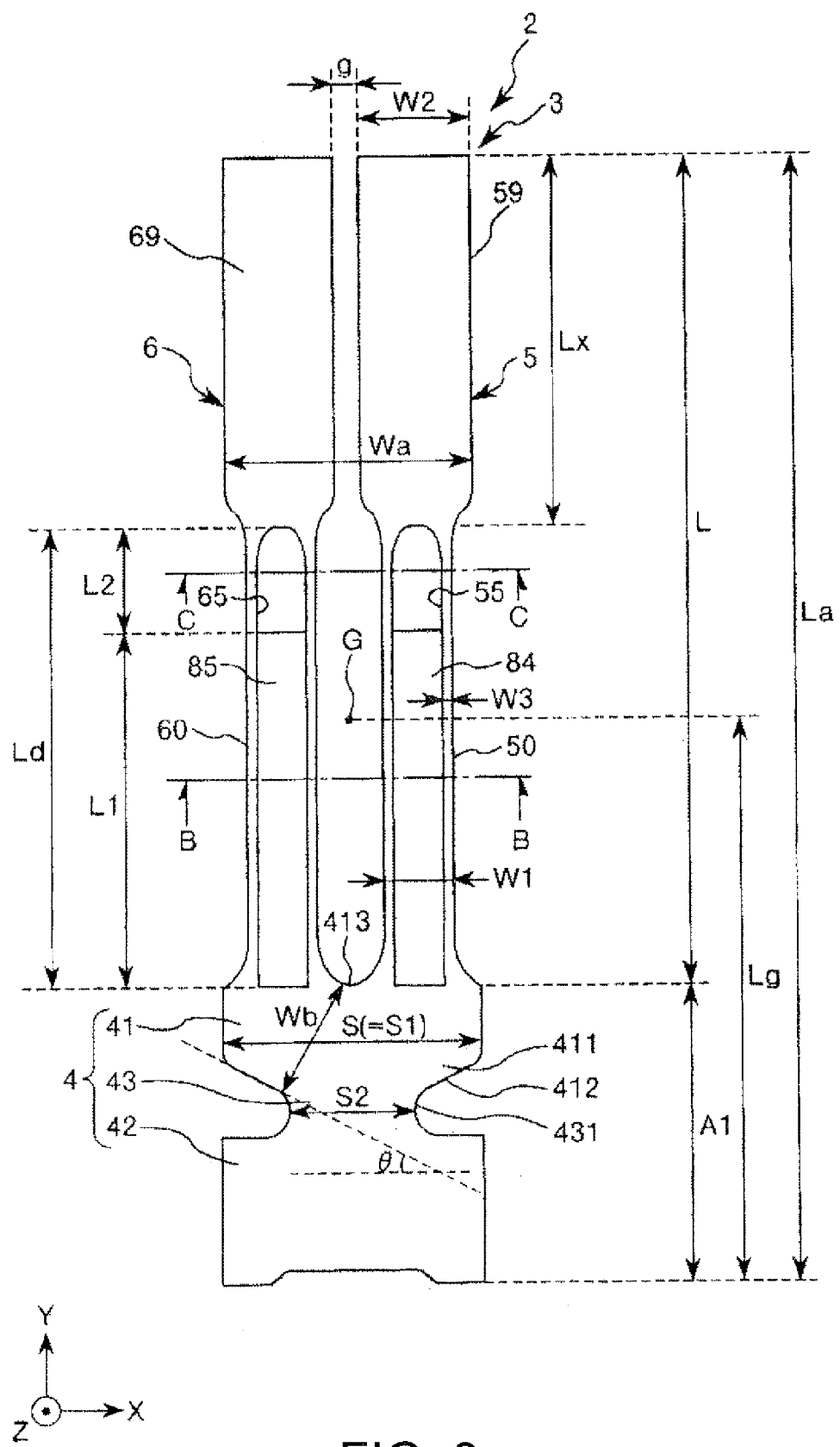
FIG. 3 is a plan view of a resonator element included in the resonator shown in FIG. 1.
Figure 4A:
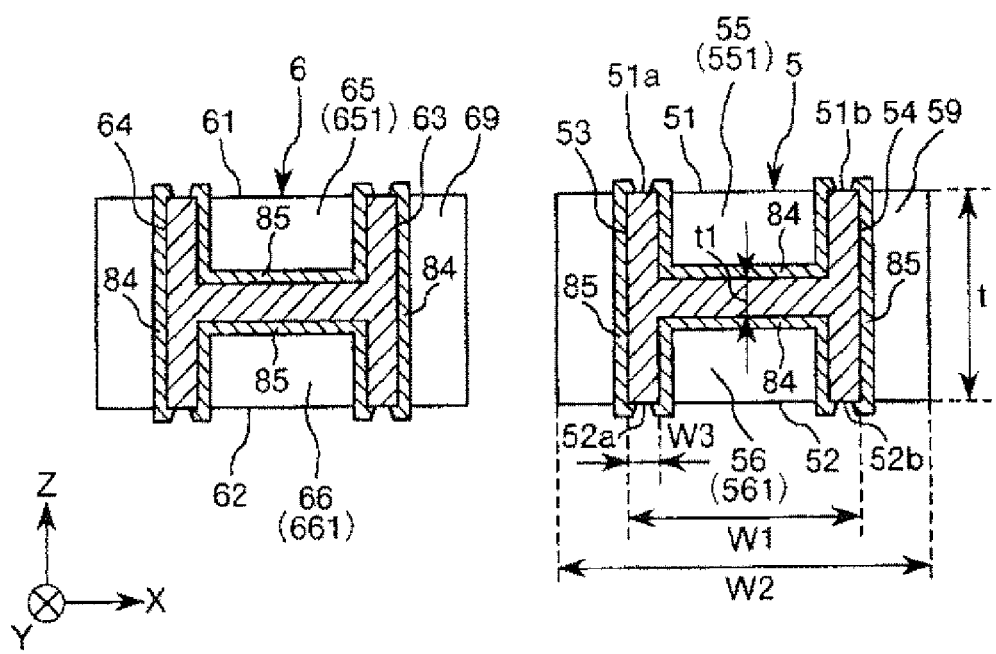
FIG. 4A is a cross-sectional view taken along line B-B of FIG. 3.
Figure 4B:
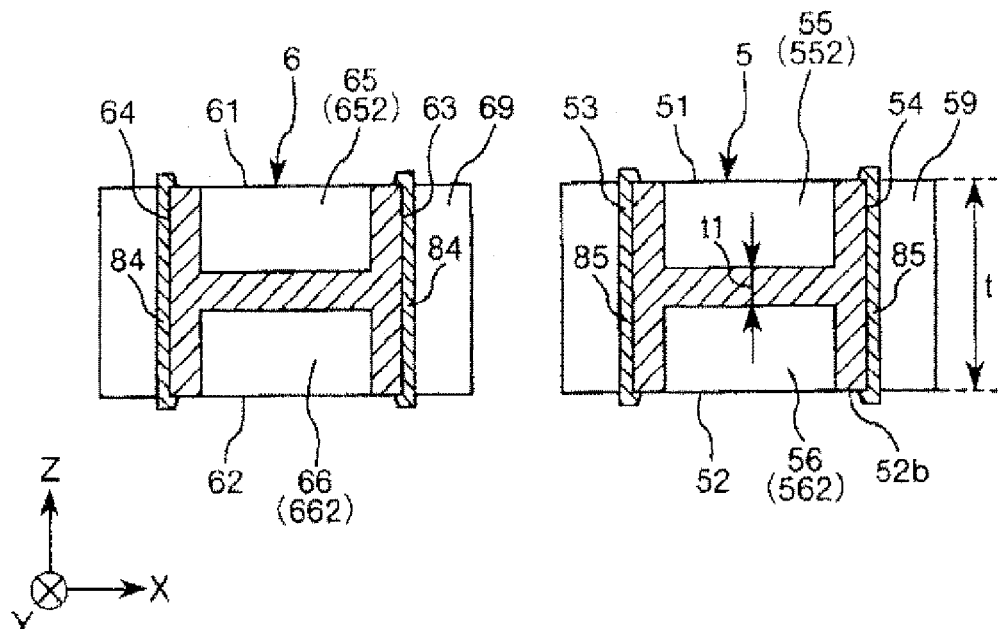
FIG. 4B is a cross-sectional view taken along line C-C of FIG. 3.
Figure 5:
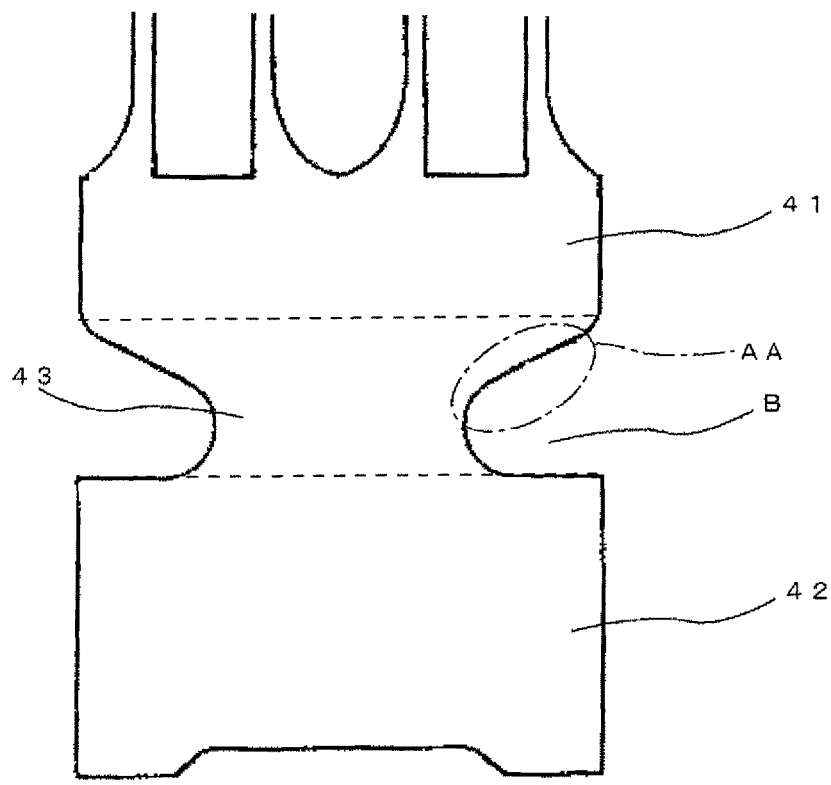
FIG. 5 is a partially-enlarged plan view illustrating a base portion of the resonator element shown in FIG. 3.

FIG. 1 is a plan view showing a resonator according to an embodiment of the invention. FIG. 2 is a cross-sectional view taken along line A-A of FIG. 1. In addition, FIG. 3 is a plan view of a resonator element included in the resonator shown in FIG. 1. FIG. 4A is a cross-sectional view taken along line B-B of FIG. 3, and FIG. 4B is a cross-sectional view taken along line C-C of FIG. 3. FIG. 5 is a partially-enlarged plan view illustrating a base portion of the resonator element shown in FIG. 3.

Hereinafter, for convenience of description, an X-axis, a Y-axis, and a Z-axis perpendicular to each other are shown in FIGS. 1 to 4B. A distal end side of each arrow shown in the drawing is set to be a "+ (positive) side" and a base end side thereof is set to be a "− (negative) side". In addition, a direction parallel to the X-axis (second direction) is referred to as an "X-axis direction", a direction parallel to the Y-axis (first direction) is referred to as a "Y-axis direction", and a direction parallel to the Z-axis is referred to as a "Z-axis direction". In addition, a +Z-side (upper side in FIG. 2) is referred to as a "top", and a −Z-side (lower side in FIG. 2) is referred to as a "bottom". In the following description, for convenience of description, the X-axis, the Y-axis, and the Z-axis shown in the drawings conform with an X-axis (electrical axis), a Y-axis (mechanical axis), and a Z-axis (optical axis) of quartz crystal constituting a quartz crystal substrate 3 to be described later, respectively.

A resonator 1 shown in FIGS. 1 and 2 includes a resonator element 2 (resonator element according to the invention) and a package 9 that accommodates the resonator element 2. Hereinafter, the resonator element 2 and the package 9 will be sequentially described in detail.

Resonator Element

First, a configuration of the resonator element 2 will be briefly described.

As shown in FIGS. 3 and 4B, the resonator element 2 includes the quartz crystal substrate 3, and a first driving electrode 84 and a second driving electrode 85 which are formed on the quartz crystal substrate 3. Meanwhile, in FIG. 3, the first driving electrode 84 and the second driving electrode 85 are partially not shown for convenience of description.

The quartz crystal substrate 3 is constituted by a Z-cut quartz crystal plate. Thus, the resonator element 2 can exhibit excellent vibration characteristics. The Z-cut quartz crystal plate refers to a quartz crystal substrate having a Z-axis (optical axis) of quartz crystal as its thickness direction. Meanwhile, it is preferable that the Z-axis of quartz crystal conforms with the thickness direction of the quartz crystal substrate 3. However, the Z-axis may be inclined slightly (approximately less than one degree) with respect to the thickness direction.

As shown in FIG. 3, the quartz crystal substrate 3 includes a base portion 4 and a pair of vibrating arms 5 and 6 extending in the Y-axis direction (first direction) from the base portion 4.

In other words, the vibrating arm includes a fixed end and a free end which are lined up along the Y-axis direction, and the fixed end is connected to the base portion 4.

The base portion 4 has a plate shape that extends on the XY plane, which is a plane parallel to the X-axis and the Y-axis, and that has the Z-axis direction as its thickness direction.

The base portion 4 has a shape in which a midway portion of the base portion 4 in the Y-axis direction is constricted when seen in a plan view from the Z-axis direction (hereinafter, simply referred to as "when seen in a plan view"). That is, as shown in FIG. 5, the base portion 4 includes a first base portion 41 from which the vibrating arms 5 and 6 extend, a second base portion 42 which is provided on the opposite side to the vibrating arms 5 and 6 with respect to the first base portion 41, and a connecting portion 43 that connects the first base portion 41 and the second base portion 42. Meanwhile, in FIG. 5, a boundary between the first base portion 41 and the connecting portion 43 and a boundary between the second base portion 42 and the connecting portion 43 are shown by a dashed line.

Here, an outer edge of the connecting portion 43 in the X-axis direction is configured as a notch portion B having a constricted shape so that the width along the X-axis direction gradually decreases with respect to the first base portion 41. In other words, the connecting portion 43 has a width-decreasing portion 411 in which the width along the X-axis direction continuously decreases toward the second base portion 42 side, in an end on the first base portion 41 side. Thus, it is possible to reduce vibration leakage while reducing the length of the base portion 41 along the Y-axis direction.

In the outer edge of the connecting portion 43 in the X-axis direction, an outer edge of a region AA surrounded by an ellipse, that is, an outer edge of the notch portion B, which is on one end side of the first base portion 41 and is biased to the center of the connecting portion 43, is constituted by a continuous line that does not include a corner portion.

That is, in a principal surface of the base portion 4, one end-side outer edge of the notch portion B on the one end side and the other end-side outer edge of the notch portion B on the other end side which is the opposite side to the one end are asymmetrical with respect to a first virtual line along the X-axis direction (second direction) which passes through the notch portion B. In the one end-side outer edge, an outer edge which passes through the center of the width of the notch portion B along the X-axis direction and which is on the central side of the connecting portion 43 with respect to a second virtual line along the Y-axis direction (first direction) is a line that does not include a corner portion. When an angle between a tangent of the outer edge and the first virtual line is set to θ, the relation of 0°<θ<90° is satisfied.

Accordingly, a junction between a curved line and a straight line does not have a corner portion A having a discontinuous curvature as described in the related art, and thus a portion on which stress is likely to concentrate is removed. Therefore, it is possible to sufficiently increase impact resistance.

Hereinafter, operations of the width-decreasing portion 411 will be described in detail with reference to FIGS. 6A to 7D.

Figure 6A:
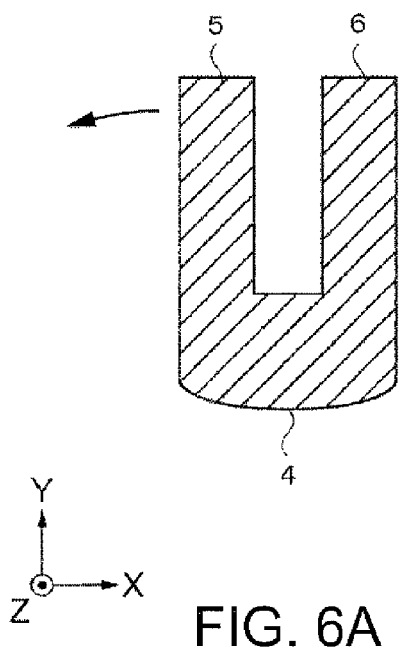
FIG. 6A is a plan view (drawing taking a width-decreasing portion into consideration) which schematically shows the resonator element shown in FIG. 3.
Figure 6B:
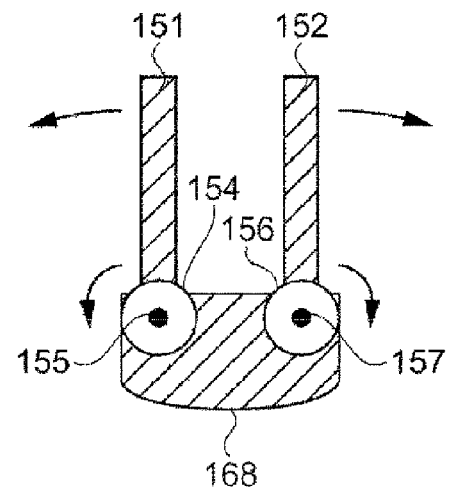
FIG. 6B is a plan view showing a simplified model of the resonator element shown in FIG. 6A.

FIG. 6A is a plan view (drawing taking the width-decreasing portion into consideration) which schematically shows the resonator element shown in FIG. 3, and FIG. 6B is a plan view showing a simplified model of the resonator element shown in FIG. 6A. In addition, FIGS. 7A to 7D are plan views illustrating a principle of suppressing vibration leakage of the resonator element shown in FIGS. 6A and 6B, and illustrating operations of portions (first to fourth connecting portions) of the base portion.

In the outer edge of the connecting portion 43 in the X-axis direction, an outer edge of the width-decreasing portion 411 on the first base portion 41 side has an effect of reducing deformation occurring in the first base portion 41 and a region of the connecting portion 43 on the first base portion 41 side due to flexural vibration of the vibrating arms.

A case where the width-decreasing portion 411 according to the invention is formed on the opposite side to the direction of the distal ends of the vibrating arms 5 and 6 is shown in FIG. 6A. As shown in FIG. 6B, the connection of an elastic rod 151 to a rotating body 154, which is a pseudo rigid body having a predetermined radius R, using a rotation axis 155 as the center of rotation and the connection of an elastic rod 152 to a rotating body 156, which is a pseudo rigid body having a radius R, using a rotation axis 157 as the center of rotation can be regarded as being made by a simplified base portion 168.

In addition, as a representative connecting portion of the simplified base portion 168, considered are a first connecting portion 158 provided on the elastic rods 151 and 152 sides with respect to the rotation axes 155 and 157, a second connecting portion 159 provided between the rotation axes 155 and 157, a third connecting portion 160 provided on the opposite side to a direction in which the elastic rods are present with respect to the rotation axes 155 and 157, and a fourth connecting portion 169 provided on the opposite side to the direction of the distal ends of the elastic rods with respect to the third connecting portion 160.

A case where the two vibrating arms 5 and 6 bend and deform so as to separate from each other is regarded as a case where the elastic rods 151 and 152 bend and deform so as to separate from each other. However, in this case, a vortex of a displacement vector is formed in a predetermined place in an opposite-side direction to the direction of the distal ends of the vibrating arms from the vicinity of roots of the vibrating arms 5 and 6. The center of the vortex is often in the vicinity of the roots of the vibrating arms 5 and 6 which includes the base portion 4, but may be formed on a virtual space which does not belong to the regions of the vibrating arms 5 and 6 and the base portion 4.

Herein, for convenience of description, it is assumed that the center of the vortex belongs to the region of the base portion 4, a distance from the elastic rod 151 is equal to a distance from the elastic rod 152, and the center of the vortex is the rotation axes 155 and 157 in FIG. 6B. Meanwhile, the displacements of outer circumferences of the rotating bodies 154 and 156 in a tangential direction, which are pseudo rigid bodies having a predetermined radius R, using the rotation axes 155 and 157 as the center of rotation are greatest in the direction of the distal end sides of the elastic rods 151 and 152 and are smallest in an opposite-side direction to the direction of the distal ends of the elastic rods 151 and 152.

Figure 7A:
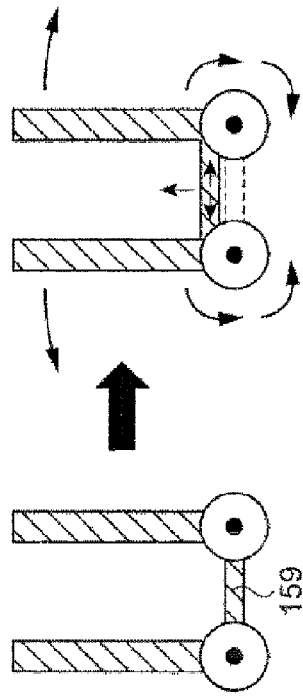
FIGS. 7A to 7D are plan views illustrating a principle of suppressing vibration leakage of the resonator element shown in FIGS. 6A and 6B, and FIGS. 7A to 7D are diagrams illustrating operations of portions (first to fourth connecting portions) of the base portion.

In FIG. 7A, the first connecting portion 158 which is representative of the simplified base portion 168 moves a little in a direction of the distal end sides of the elastic rods 151 and 152 while being strongly extended by the rotational movement of the rotating bodies 154 and 156 which are pseudo rigid bodies.

Figure 7C:
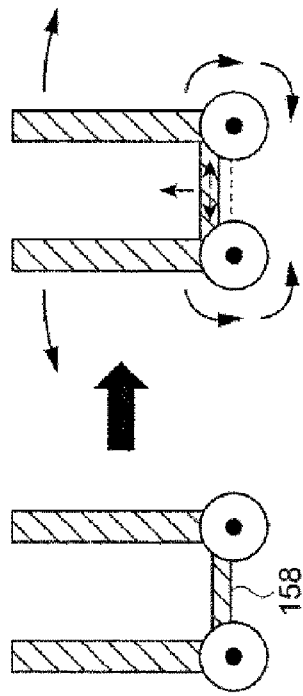
Figure 7B:
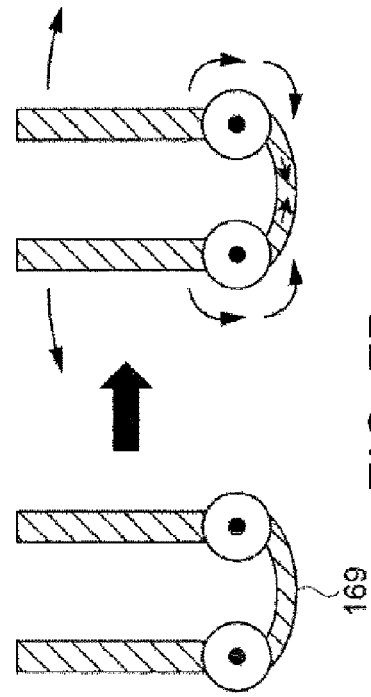

In FIG. 7B, similarly, the second connecting portion 159 which is representative of the simplified base portion 168 moves in the direction of the distal end sides of the elastic rods 151 and 152 while being extended by the rotational movement of the rotating bodies 154 and 156 which are pseudo rigid bodies.

In FIG. 7C, the third connecting portion 160 which is representative of the simplified base portion 168 moves in the direction of the distal end sides of the elastic rods 151 and 152 while being compressed by the rotational movement of the rotating bodies 154 and 156 which are pseudo rigid bodies. However, at this time, the vicinity of the center of the third connecting portion 160 in the longitudinal direction has potential to be deformed in either the direction of the distal end sides of the elastic rods 151 and 152 or the opposite-side direction to the direction of the distal end sides of the elastic rods 151 and 152.

Figure 7D:
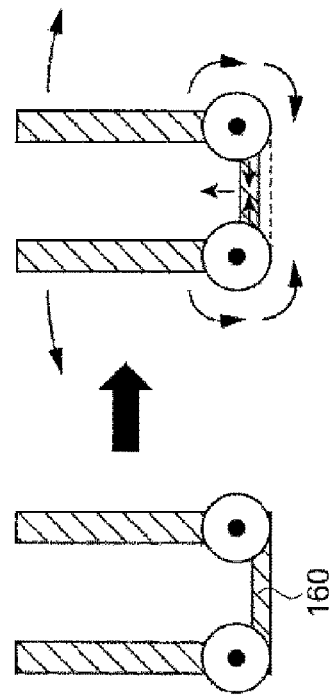

In FIG. 7D, the fourth connecting portion 169 which is representative of the simplified base portion 168 is compressed by the rotational movement of the rotating bodies 154 and 156 which are pseudo rigid bodies, but is not likely to deform due to its arch shape. Further, in the case of deformation, the fourth connecting portion deforms so that the vicinity of the center of the fourth connecting portion 169 in the longitudinal direction is displaced in the opposite-side direction to the direction of the distal ends of the elastic rods 151 and 152.

Therefore, in the first to fourth connecting portions 158, 159, 160, and 169 which are representative of the simplified base portion 168, an operation of offsetting vibration displacement while generating the deformation of compression and extension works in a direction in which the rotation axes 155 and 157 are connected to each other, by the separation movement of the elastic rods 151 and 152. The displacement of the first to third connecting portions 158, 159, and 160 in the direction of the distal end sides of the elastic rods 151 and 152 can be disturbed due to difficulty in deformation of the fourth connecting portion 169 and can be offset by the vicinity of the center of the fourth connecting portion 169 in the longitudinal direction deforming so as to be displaced in the opposite-side direction to the direction of the distal ends of the elastic rods 151 and 152.

As a result, when a fixation member is formed in the simplified base portion 168, that is, when a fixation member is formed in a base portion 167, energy leaking to the outside is reduced through the fixation member. Thus, it is possible to reduce vibration leakage and to reduce a decrease in a Q value.

The vibrating arms 5 and 6 extend in the +Y-axis direction from the base portion 4 so as to be lined up in the X-axis direction and to be parallel to each other. Each of the vibrating arms 5 and 6 has an elongated shape. The base end of each of the vibrating arms is a fixed end, and the distal end thereof is a free end. In addition, the distal ends of the vibrating arms 5 and 6 are provided with weight portions 59 and 69 having a width along the X-axis direction which is larger than those of the base ends of the vibrating arms 5 and 6.

As shown in FIGS. 4A and 4B, the vibrating arm 5 includes a pair of principal surfaces 51 and 52, which are on the XY plane, and a pair of side surfaces 53 and 54 which are on the YZ plane and connect the pair of principal surfaces 51 and 52. In addition, the vibrating arm 5 includes a bottomed-groove (groove portion) 55 opened to the principal surface 51 and a bottomed-groove (groove portion) 56 opened to the principal surface 52. The grooves 55 and 56 extend in the Y-axis direction. The cross-sections of portions of the vibrating arm 5 in which the grooves 55 and 56 are formed have a substantially H shape.

Similarly to the vibrating arm 5, the vibrating arm 6 includes a pair of principal surfaces 61 and 62, which are on the XY plane, and a pair of side surfaces 63 and 64 which are on the YZ plane and connect the pair of principal surfaces 61 and 62. In addition, the vibrating arm 6 includes a bottomed-groove (groove portion) 65 opened to the principal surface 61 and a bottomed-groove (groove portion) 66 opened to the principal surface 62. The grooves 65 and 66 extend in the Y-axis direction. The cross-sections of portions of the vibrating arm 6 in which the grooves 65 and 66 are formed have a substantially H shape.

As shown in FIGS. 4A and 4B, it is preferable that the grooves 55 and 56 are formed to be symmetrical (symmetrical in the vertical direction) with respect to a segment dividing the thickness of the vibrating arm 5 into two parts in the cross-section. Similarly, it is preferable that the grooves 65 and 66 are formed to be symmetrical (symmetrical in the vertical direction) with respect to a segment dividing the thickness of the vibrating arm 6 into two parts in the cross-section. Thus, it is possible to suppress unnecessary vibrations of the vibrating arms 5 and 6 and to efficiently vibrate the vibrating arms 5 and 6 in an in-plane direction of the quartz crystal substrate 3.

A pair of first driving electrodes 84 and a pair of second driving electrodes 85 are formed in the vibrating arm 5. Specifically, one of the first driving electrodes 84 is formed on the inner surface of the groove 55, and the other first driving electrode 84 is formed on the inner surface of the groove 56. In addition, one of the second driving electrodes 85 is formed on the side surface 53, and the other second driving electrode 85 is formed on the side surface 54.

Similarly, a pair of first driving electrodes 84 and a pair of second driving electrodes 85 are formed in the vibrating arm 6. Specifically, one of the first driving electrodes 84 is formed on the side surface 63, and the other first driving electrode 84 is formed on the side surface 64. In addition, one of the second driving electrodes 85 is formed on the inner surface of the groove 65, and the other second driving electrode 85 is formed on the inner surface of the groove 66.

When an alternating voltage is applied between the first driving electrode 84 and the second driving electrode 85, the vibrating arms 5 and 6 vibrate with a predetermined frequency in an in-plane direction (direction of the XY plane) so that the vibrating arms alternately repeat mutual approach and separation.

Materials of the first driving electrode 84 and the second driving electrode 85 are not particularly limited. For example, the electrodes can be formed of a metal material such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), or zirconium (Zr), or a conductive material such as indium tin oxide (ITO).

Until now, the configuration of the resonator element 2 has been described briefly. Hereinafter, characteristic parts of the resonator element 2 will be described in detail.

As described above, the base portion 4 includes the first base portion 41, the second base portion 42, and the connecting portion 43. Thus, it is possible to reduce vibration leakage while reducing the length of the base portion 4 along the Y-axis direction.

Here, when a width of the first base portion 41 along the X-axis direction is set to S1 and a minimum width of the connecting portion 43 along the X-axis direction is set to S2, it is preferable that S2/S1 is equal to or greater than 0.3 and equal to or less than 0.6. Thus, it is possible to efficiently reduce vibration leakage while reducing the length of the base portion 4 along the Y-axis direction.

In addition, the first base portion 41 includes the width-decreasing portion 411 which is provided at the end of the first base portion 41 on the connecting portion 43 side and which has a width along the X-axis direction decreasing continuously or intermittently toward the connecting portion 43. Thus, it is possible to effectively suppress the deformation of the first base portion 41 which is associated with the flexural vibration of the pair of vibrating arms 5 and 6 which mutually approach and separate in the same plane. As a result, even when the length of the first base portion 41 along the Y-axis direction is reduced, it is possible to suppress the deformation of the first base portion 41 which is associated with the flexural vibration of the pair of vibrating arms 5 and 6 alternately repeating mutual approach and separation substantially in a plane and to suppress vibration leakage to the outside from the base portion 4.

In this embodiment, when an outer edge 412 of the width-decreasing portion 411 and an outer edge 431 of the connecting portion 43 form a curved line that does not include a corner portion, when seen in a plan view, and when an angle between a tangent of a portion of the curved line on the first base portion 41 side and a segment parallel to the X-axis direction is set to θ, the relation of 0°<θ<90° is satisfied. Thus, it is possible to reduce stress occurring in the base portion 4 and to reduce thermoelastic loss.

In addition, it is preferable to satisfy the relation of 6°≤θ≤70°. Thus, it is possible to produce preferable effects by the width-decreasing portion 411 and the connecting portion 43. That is, it is possible to reduce stress occurring in the base portion and to more effectively reduce thermoelastic loss.

In addition, as described above, in a case where a resonance frequency f of the resonator element 2 is set to become greater than a thermal relaxation frequency f0, when a base portion bending width which is a shortest distance between the outer edge 431 of the connecting portion 43 and an outer edge 413 of a crotch portion formed between the pair of vibrating arms 5 and 6, when seen in a plan view, is set to Wb and when effective arm widths which are arm widths of the vibrating arms, obtained by replacing the cross-sectional shapes of the vibrating arms 5 and 6 in a surface perpendicular to the longitudinal directions of the vibrating arms 5 and 6 with rectangular shapes having the same thickness with equivalent thermoelastic loss, are set to We, it is preferable to satisfy the relation of Wb>We. Thus, since thermoelastic loss occurring in the cross-section of the first base portion 41 becomes smaller than the thermoelastic loss occurring in the vibrating arms 5 and 6, the degradation in a Q value of the resonator element 2 due to the thermoelastic loss of the first base portion 41 is suppressed. Accordingly, it is possible to increase the Q value.

In addition, when a width of the entirety of the pair of vibrating arms 5 and 6 along the X-axis direction is set to Wa and a width of the base portion 4 along the X-axis direction is set to S, it is preferable that Wa/S (more specifically, Wa/S1) is equal to or greater than 85% and equal to or less than 115%. Thus, it is possible to reduce the width of the resonator element 2 along the X-axis direction and to increase the strength of the vibrating arms 5 and 6 and a Q value.

In addition, as described above, the vibrating arm 5 is provided with the grooves 55 and 56. Similarly, the vibrating arm 6 is provided with the grooves 65 and 66. That is, the vibrating arm 5 includes the bottomed-grooves (groove portions) 55 and 56 which are formed in the two principal surfaces 51 and 52 of the vibrating arm 5 along the X-axis direction and the Y-axis direction and which extend in the Y-axis direction. Similarly, the vibrating arm 6 includes the bottomed-grooves (groove portions) 65 and 66 which are formed in the two principal surfaces 61 and 62 of the vibrating arm 6 along the X-axis direction and the Y-axis direction and which extend in the Y-axis direction.

According to the vibrating arms 5 and 6 in which the grooves 55, 56, 65, and 66 are formed, heat generated in association with the in-plane flexural vibration of the vibrating arms 5 and 6 is not likely to diffuse (heat conduction). Thus, it is possible to suppress thermoelastic loss in an adiabatic region which is a region where a bending vibration frequency (mechanical bending vibration frequency) f is greater than a thermal relaxation frequency f0 (f>f0). That is, by the relation of f/f0>1 being satisfied, it is possible to set the vibrating arms 5 and 6 as adiabatic regions and to reduce a decrease in a Q value.

In general, when a groove is formed in a principal surface of a vibrating arm, the mechanical strength of the vibrating arm is decreased. It is possible to increase the strength of the vibrating arm and to reduce thermoelastic loss by increasing the width or thickness of the vibrating arm.

Here, a resonance frequency f of a fundamental wave of a tuning fork type resonator element is known to satisfy the following expression.

$$f \propto W/L^2 \qquad (1)$$

Meanwhile, W denotes a width of an arm portion, and L denotes a length of the arm portion.

That is, when the resonance frequency of the fundamental wave is made constant, a relationship is established in which the smaller the length L of the arm portion of the resonator element, the smaller the width W of the arm portion.

Consequently, when the length of the vibrating arm is made constant and the resonance frequency of the fundamental wave is set to, for example, 32.768 (kHz) and when the vibrating arm is constituted by a first arm portion and a second arm portion (weight portion) having a width which is larger than that of the first arm portion in order merely to improve a Q value, the frequency is reduced from 32.768 (kHz) due to a weight effect of the weight portion. Accordingly, it is necessary to increase the width of the first arm portion of the vibrating arm in order to maintain a constant resonance frequency, for the purpose of avoiding the reduction in the frequency. Meanwhile, there is a concern that stress may concentrate on a bonding portion between the first arm portion and the second arm portion (weight portion). Thus, it is necessary to optimize a relationship between the width of the first arm portion and the width of the second arm portion (weight portion) so that damage does not occur in a case where excessive external force is applied thereto, and to improve impact resistance while maintaining the frequency of 32.768 (kHz).

Consequently, the vibrating arms 5 and 6 have configurations to be described below and have optimized dimensions.

As described above, the distal ends of the vibrating arms 5 and 6 are provided with the weight portions 59 and 69 having a width along the x-axis direction which is larger than those of the base ends of the vibrating arms 5 and 6. That is, the vibrating arms 5 and 6 include arm portions 50 and 60 extending from the base portion 4, and the weight portions 59 and 69 which are provided on the opposite side to the base portion 4 with respect to the arm portions 50 and 60 and have a width along the X-axis direction which is larger than those of the arm portions 50 and 60.

In this manner, by the weight portions 59 and 69 being provided on the distal end sides of the vibrating arms 5 and 6, a Q value is improved, and the widths of the arm portions 50 and 60 of the vibrating arms 5 and 6 are increased, and thus it is possible to maintain a constant resonance frequency of flexural vibration. Accordingly, it is possible to increase the strength of the vibrating arms 5 and 6 and to increase a Q value by reducing thermoelastic loss. As a result, it is possible to increase impact resistance and to decrease an equivalent series resistance CI value.

In particular, when each of widths of the arm portions 50 and 60 along the X-axis direction (hereinafter, referred to as "widths of the arm portions 50 and 60" or "arm widths") is set to W1, each of widths (hereinafter, referred to as "bank widths") of portions positioned on both sides of each of the grooves 55, 56, 65, and 66 of the vibrating arms 5 and 6 (hereinafter, referred to as "bank portions") is set to W3, and 2×W3/W1 is set to η, it is preferable to satisfy the relation of 14.2%<η<100% (100% indicates a state where a groove is not formed in the arm portion).

In this manner, a ratio of each of the widths of the grooves 55, 56, 65, and 66 along the X-axis direction (hereinafter, also simply referred to as "widths of the groove 55 and the like") with respect to each of the widths of the arm portions 50 and 60 of the vibrating arms 5 and 6 is optimized, and thus it is possible to efficiently increase the strength of the vibrating arms 5 and 6 and a Q value. Here, the width W3 of the bank portion of the vibrating arm 5 is a width of each of two portions 51a and 51b along the X-axis direction with the groove 55 interposed therebetween in the principal surface 51 or a width of each of two portions 52a and 53b along the X-axis direction with the groove 56 interposed therebetween in the principal surface 52. Meanwhile, the width W3 of the bank portion of the vibrating arm 6 is the same as the width W3 of the bank portion of the vibrating arm 5.

Hereinafter, η will be described in detail.

The inventor has verified, by a simulation, a Q value in a case where the ratio η of the width of the bank portion with respect to each of the widths of the arm portions 50 and 60 is changed while increasing the widths of the arm portions 50 and 60.

Figure 8:
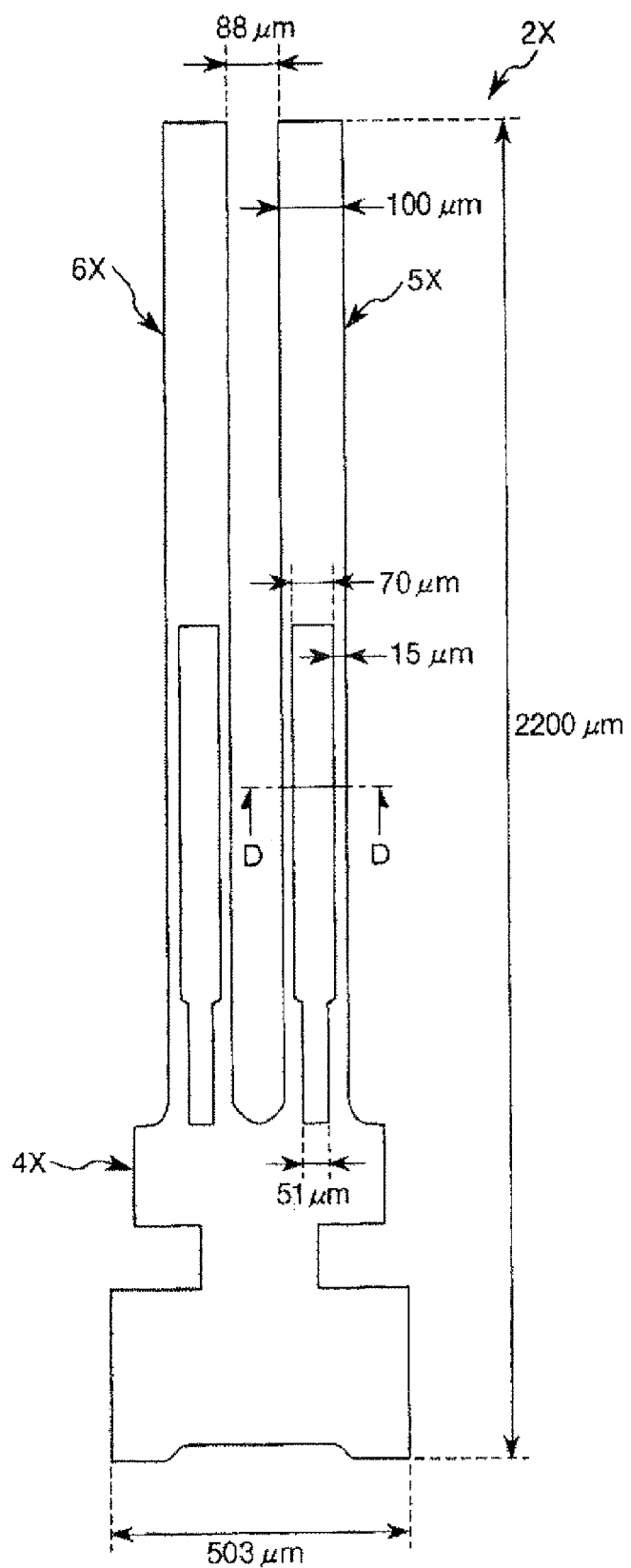
FIG. 8 is a plan view showing a resonator element of the related art.
Figure 9A:
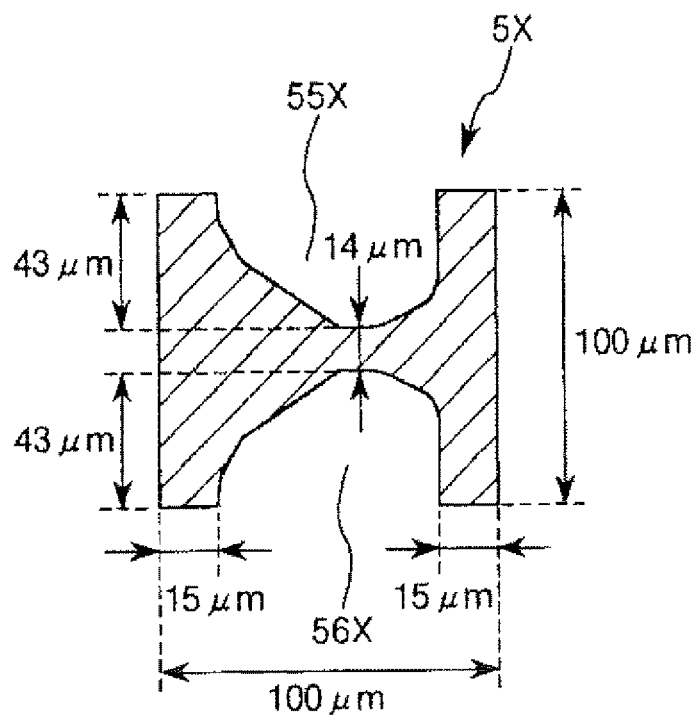
FIG. 9A is a cross-sectional view (cross-sectional view taken along line D-D of FIG. 8) of a vibrating arm of the resonator element of the related art.
Figure 9B:
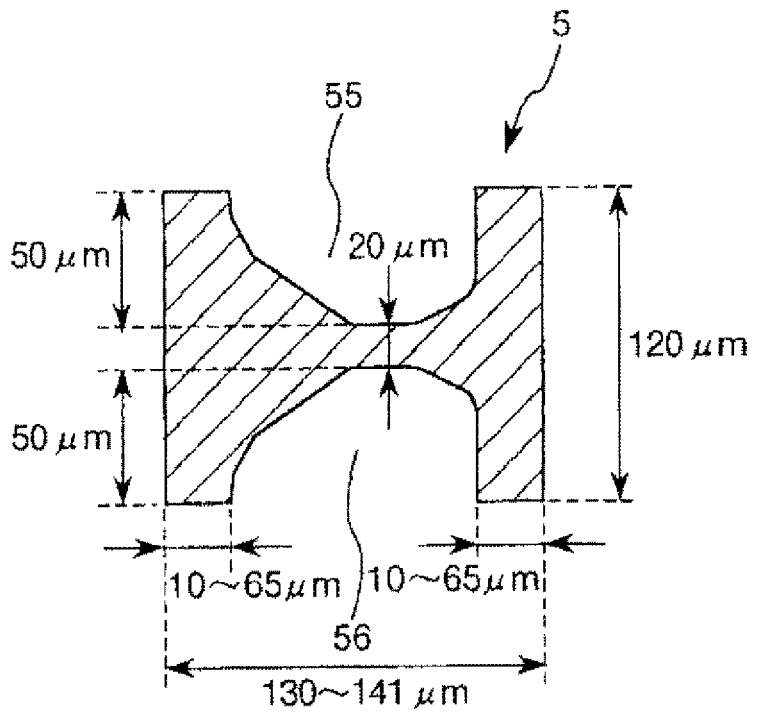
FIG. 9B is a diagram showing an example of a cross-section of a vibrating arm of the resonator element according to the invention.

FIG. 8 is a plan view showing the resonator element disclosed in JP-A-2011-223229 mentioned in the related art. FIG. 9A is a cross-sectional view (cross-sectional view taken along line D-D of FIG. 8) of the vibrating arm of the resonator element disclosed in JP-A-2011-223229 of the related art, and FIG. 9B is a diagram showing an example of a cross-section of the vibrating arm of the resonator element according to the invention.

In this simulation, the resonator element 2 having a plan-view shape (with a weight portion) which is shown in FIG. 3 and a resonator element 2X having a plan-view shape (without a weight portion) which is shown in FIG. 8 are used. In the resonator element 2X used in this simulation, cross-sections of vibrating arms 5X and 6X are set to have shapes and dimensions as shown in FIG. 9A so that a resonance frequency is set to 32.768 kHz. On the other hand, the resonator element 2 used in this simulation is set to have the same resonance frequency, entire length, and total width as those of the resonator element 2X, and the cross-sections of the vibrating arms 5 and 6 of the resonator element 2 are set to have shapes and dimensions as shown in FIG. 9B.

The dimensions of the vibrating arms 5 and 6 of the resonator element 2 have been evaluated in the following ranges.

Widths W2 of the weight portions 59 and 69: 215 (μm)
Widths W1 of the arm portions 50 and 60: 130 to 141 (μm)
Widths W3 of the bank portions: 10 to 65 (μm)
Thicknesses t of the arm portions 50 and 60: 120 (μm)
Depths of the grooves 55, 56, 65, and 66: 50 (μm)

Figure 10:
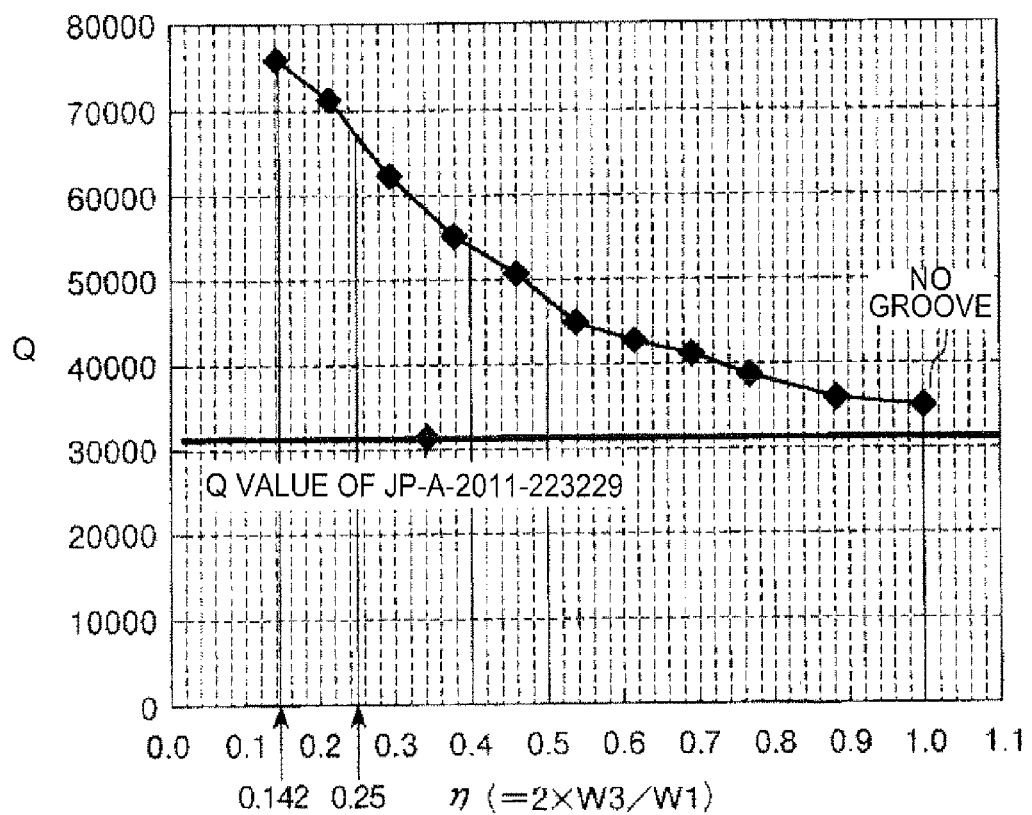
FIG. 10 is a graph showing a relationship between a ratio of a width of a bank portion with respect to a width of an arm portion and a Q value.

The results of this simulation are shown in Table 1 and FIG. 10.

TABLE 1

| Plate thickness [μm] | Groove Depth [μm] | Bank width [μm] | Arm width [μm] | η | Q value |
|---|---|---|---|---|---|
| 120 | 50 | 10 | 141 | 0.142 | 75.834 |
|  |  | 15 | 141 | 0.213 | 71.213 |
|  |  | 20 | 136 | 0.294 | 62.267 |
|  |  | 25 | 132 | 0.379 | 55.341 |
|  |  | 30 | 130 | 0.462 | 50.755 |
|  |  | 35 | 130 | 0.538 | 44.943 |
|  |  | 40 | 130 | 0.615 | 42.788 |

TABLE 1-continued

| Plate thickness [μm] | Groove Depth [μm] | Bank width [μm] | Arm width [μm] | η | Q value |
|---|---|---|---|---|---|
|  |  | 45 | 130 | 0.692 | 41.272 |
|  |  | 50 | 130 | 0.769 | 38.714 |
|  |  | 57.5 | 130 | 0.885 | 35.961 |
|  |  | 65 | 130 | 1 | 35.168 |

Meanwhile, a Q value shown in Table 1 is calculated as a value in a case where the resonance frequency is set to 32.768 kHz by correcting a slight deviation of the resonance frequency.

FIG. 10 is a graph showing a relationship between a ratio of the width of the bank portion with respect to the width of the arm portion and the Q value.

As shown in FIG. 10, it is confirmed that the shape "with a weight portion" is improved in excess of the Q value (31,573) of JP-A-2011-223229 in the range of 14.2%<η<100%.

In addition, as shown in FIG. 10, it can be observed that the Q value becomes larger as η becomes smaller. However, it is confirmed, by a simulation, that the Q value starts falling when the width of the bank portion becomes smaller than 7 (μm). Further, when the width of the bank portion is 7 (μm)), the ratio of the η value is reduced to 9.9% (=7×2/141) and 10.7% (=7×2/130). Thus, a decrease in the mechanical strength of the vibrating arm and a so-called reduction in impact resistance have been problems.

Further, even when the width W1 of each of the arm portions 50 and 60 and the width W3 of each bank portion are set to be in the following ranges, it is confirmed that the Q value is greater than the Q value (31,573) in JP-A-2011-223229.

Widths W1 of the arm portions 50 and 60: 120 to 150 (μm)
Width W3 of the bank portion: 15 to 30 (μm)

At this time, η is as follows.

$$\eta = 2 \times W3/W1 = 2 \times 15 \text{ μm}/120 \text{ μm} = 25.0\%$$

$$\eta = 2 \times W3/W1 = 2 \times 30 \text{ μm}/120 \text{ μm} = 50.0\%$$

$$\eta = 2 \times W3/W1 = 2 \times 15 \text{ μm}/150 \text{ μm} = 20.0\%$$

$$\eta = 2 \times W3/W1 = 2 \times 30 \text{ μm}/150 \text{ μm} = 40.0\%$$

Therefore, η satisfies the following relation.

$$20.0\% \leq \eta \leq 50.0\%$$

Further, a ratio of the width W2 of each of the weight portions 59 and 69 with respect to the width W1 of each of the arm portions 50 and 60 is as follows.

$$W2/W1 = 215/120 = 1.79$$

$$W2/W1 = 215/150 = 1.43$$

Therefore, W2/W1 satisfies the following relation.

$$1.43 \leq W2/W1 \leq 1.79$$

Here, W2/W1 is set to have the above-described relation, and thus it is possible to reduce stress concentrating on bonding portions between the arm portions 50 and 60 and the weight portions 59 and 69. Accordingly, even when an excessive external force is applied, it is possible to improve impact resistance without causing any damage.

From the above-described relationship between η and the Q value, the relation of 14.2%<η<100% is satisfied. Thus, it is possible to efficiently increase the strength of the vibrating arms 5 and 6 and the Q value without increasing the lengths of the vibrating arms 5 and 6. However, in order to increase the effects, it is preferable to satisfy the relation of 20%≤η≤50% and more preferable to satisfy the relation of 30%≤η≤40% in consideration of the impact resistance of the resonator elements.

Modification Example of Resonator Element

Next, a resonator element according to a modification example of the invention will be described.

Hereinafter, the resonator element according to the modification example will be described focusing on the differences from the resonator element included in the resonator according to the first embodiment described above, and a description of the same matters will be omitted. In the above-described embodiment, a configuration is adopted in which one groove is provided in each principal surface of each vibrating arm. However, the number of grooves is not particularly limited, and two or more grooves may be provided. For example, two grooves lined up along the X-axis direction may be provided in each principal surface.

The resonator element according to this modification example is the same as the resonator element according to the first embodiment described above except that the number of grooves provided in each principal surface of each vibrating arm is different.

The resonator element according to the modification example is provided with two bottomed-grooves opened to one principal surface of each vibrating arm and is provided with two bottomed-grooves opened to the other principal surface.

A portion interposed between one side surface, which connects the one principal surface and the other principal surface, and an outer edge of the groove lined up with the one side surface along the X-axis direction is set to one bank portion, and a width of the one bank portion along the X-axis direction is set to W3.

In addition, a portion interposed between the other side surface, which connects the one principal surface and the other principal surface, and an outer edge of the groove lined up with the other side surface along the X-axis direction is set to the other bank portion, and a width of the other bank portion along the X-axis direction is set to W3.

Accordingly, since a width of the arm portion along the X-axis direction is W1, W2×W3/W1 is set to η.

In addition, when the entire length of each of the vibrating arms 5 and 6 along the Y-axis direction (hereinafter, also simply referred to as "length of each of the vibrating arms 5 and 6") is set to L and a length of each of the weight portions 59 and 69 along the Y-axis direction (hereinafter, also simply referred to as "length of each of the weight portions 59 and 69") is set to Lx, it is preferable that Lx/L is equal to or greater than 20% and equal to or less than 60%.

In this manner, Lx/L is optimized, and thus it is possible to more efficiently increase the strength of the vibrating arms 5 and 6 and a Q value without increasing the lengths of the vibrating arms 5 and 6.

Hereinafter, Lx/L and W2/W1 will be described in detail.

Figure 11:
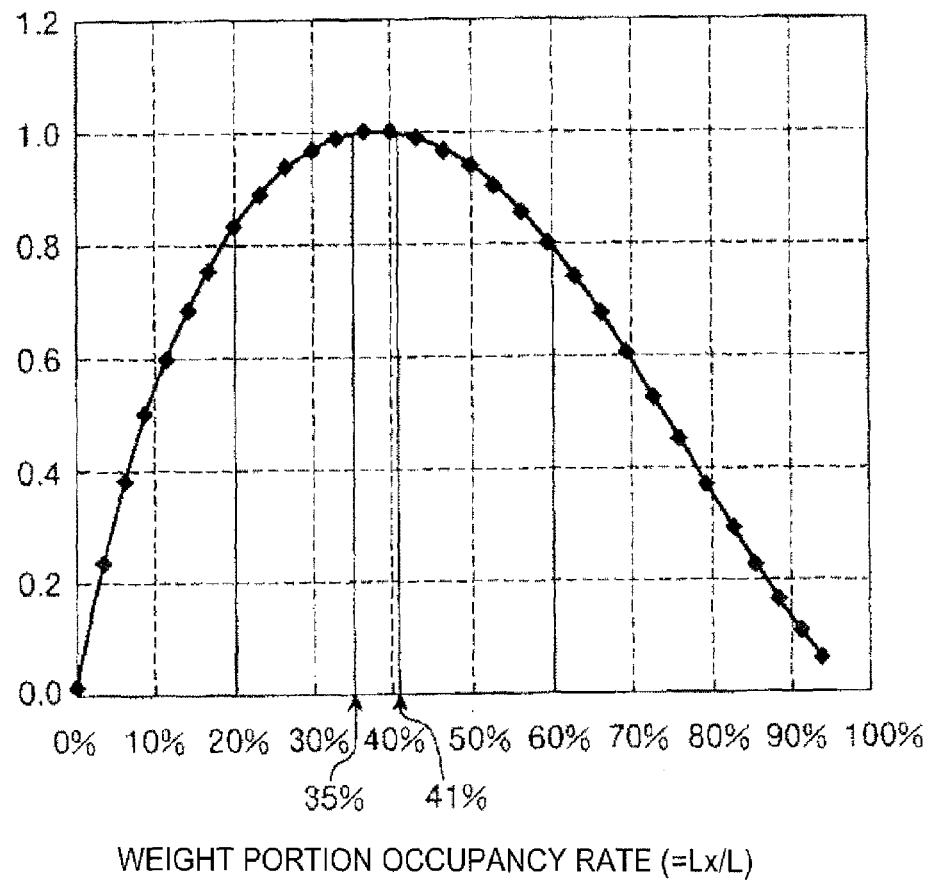
FIG. 11 is a graph showing a relationship between a weight portion occupancy rate and a high performance index.

FIG. 11 is a graph showing a relationship between a weight portion occupancy rate and a high performance index.

In FIG. 11, a horizontal axis represents a weight portion occupancy rate (%) which is a ratio (Lx/L) of a length Lx of each of the weight portions 59 and 69 with respect to the length L of each of the vibrating arms 5 and 6, and a vertical axis represents a high performance index which is defined as a value obtained by multiplying a low frequency index by a high Q value index. Here, the low frequency index is an index indicating that a low frequency of the resonator element (in other words, a reduction in the size of the resonator element) can be efficiently achieved as a value becomes larger. In addition, the high Q value index is an index indicating that a decrease in the Q value of the resonator element can be efficiently reduced as a value becomes larger.

As shown in FIG. 11, when the weight portion occupancy rate is 38%, the high performance index is set to a maximum value (1.0). That is, when Lx/L is 38%, it is possible to most efficiently achieve both a low frequency (reduction in size) of the resonator element and a high Q value.

Accordingly, in the resonator element 2 according to the invention, Lx/L is set to equal to or greater than 20% and equal to or less than 60% based on approximately 38% so that the high performance index is set to equal to or greater than 0.8 as shown in FIG. 11, and thus it is possible to efficiently achieve a reduction in size and a high Q value.

In addition, it is preferable that Lx/L is equal to or greater than 35% and equal to or less than 41%. Thus, it is possible to set the high performance index to a value close to a maximum value as shown in FIG. 11 and to more efficiently achieve a reduction in size and a high Q value.

When the width of each of the weight portions 59 and 69 along the X-axis direction (hereinafter, also simply referred to as "width of each of the weight portions 59 and 69") is set to W2 as described above in realizing the high performance index from the above-described relationship between the weight portion occupancy rate and the high performance index, it is preferable that W2/W1 is equal to or greater than 1.43 and equal to or less than 1.79.

In this manner, W2/W1 is optimized, and thus it is possible to produce effects (weight effects) obtained by providing the weight portions 59 and 69, while suppressing an increase in the entire width of the resonator element 2 along the X-axis direction.

In addition, the width W1 of each of the arm portions 50 and 60 is preferably equal to or greater than 120 μm and equal to or less than 150 μm, and is more preferably equal to or greater than 130 μm and equal to or less than 141 μm. Thus, it is possible to increase the strength of the vibrating arms 5 and 6 while maintaining a constant frequency of the resonator element 2, and to reduce thermoelastic loss.

In addition, a thickness t of each of the arm portions 50 and 60 is preferably equal to or greater than 100 μm and equal to or less than 300 μm, is more preferably equal to or greater than 110 μm and equal to or less than 200 μm, and is further preferably equal to or greater than 115 μm and equal to or less than 150 μm. Accordingly, the arm portions 50 and 60 of the vibrating arms 5 and 6 become relatively thicker, and thus it is possible to increase the strength of the vibrating arms 5 and 6. In addition, it is possible to secure large areas of the vibrating arms 5 and 6 to which an electric field is applied by the relatively large thicknesses of the arm portions 50 and 60 of the vibrating arms 5 and 6. That is, since it is possible to increase the size of an area of an excitation portion interposed between the first driving electrode 84 and the second driving electrode 85, electric field efficiency can be increased. Thus, it is possible to decrease a CI value.

In contrast, when the thickness t of each of the arm portions 50 and 60 is too small, there is a tendency for the strength of the vibrating arms 5 and 6 to be considerably reduced. On the other hand, when the thickness t of each of the arm portions 50 and 60 is too large, it becomes difficult to form the external form of the resonator element 2 only by wet etching.

In addition, when a thickness of each of the arm portions 50 and 60 is set to t and each of a distance between the grooves 55 and 56 and a distance between the grooves 65 and 66 (that is, the thickness of the central portion of each of the vibrating arms 5 and 6 in the width direction) is set to t1, t1/t is preferably equal to or greater than 10% and equal to or less than 40%, is more preferably equal to or greater than 15% and equal to or less than 30%, and is further preferably equal to or greater than 15% and equal to or less than 20%. Thus, it is possible to secure large areas of the vibrating arms 5 and 6 to which an electric field is applied, while increasing the strength of the vibrating arms 5 and 6.

In addition, the width W3 of each of the bank portions of the vibrating arms 5 and 6 is preferably equal to or greater than 15 μm and equal to or less than 30 μm, and is more preferably equal to or greater than 18 μm and equal to or less than 25 μm. Thus, it is possible to reduce an equivalent series resistance CI value while increasing the strength of the vibrating arms 5 and 6.

In addition, as shown in FIGS. 4A and 4B, the groove 55 includes an electrode-formed region 551 which is a portion where the first driving electrode (excitation electrode) 84 is provided, and a non-electrode-formed region 552 which is positioned on the opposite side to the base portion 4 with respect to the electrode-formed region 551 and which is a portion where a driving electrode is not provided. Similarly, the groove 56 includes an electrode-formed region 561 and a non-electrode-formed region 562, the groove 65 includes an electrode-formed region 651 and a non-electrode-formed region 652, and the groove 66 includes an electrode-formed region 661 and a non-electrode-formed region 662.

By the non-electrode-formed regions 552, 562, 652, and 662 (hereinafter, also referred to as "non-electrode-formed region 552 and the like") being formed, it is possible to generate a vibration (fundamental wave) in a main mode in which an equivalent series capacitance C1 is reduced, while suppressing the generation of a vibration (harmonic) in a high-order mode.

Here, a relationship between a fundamental wave CI value and a CI value ratio and a relationship between a fundamental wave CI value and a length of a groove portion will be described.

The resonator element 2 is configured to oscillate a signal with a fundamental wave frequency by the vibration thereof, but has a characteristic of simultaneously oscillating the same signal also with a harmonic wave frequency. In addition, there is a concern that the picking-up of this harmonic signal being performed by mistake for a signal having a fundamental wave frequency in a device such as a resonator may result in an abnormality in the device.

Consequently, a design method performed on the basis of a CI value ratio is used as a method of forestalling such a situation. The CI value ratio is a ratio obtained by dividing a high-frequency CI value (equivalent series resistance) by a fundamental wave CI value (equivalent series resistance) (high-frequency CI value/fundamental wave CI value). That is, when the high-frequency CI value becomes greater than the fundamental wave CI value and the CI value ratio is set to equal to or greater than 1.0, a signal is not likely to oscillate with a high frequency. Accordingly, there is little concern that a device or the like may erroneously pick up a harmonic signal, and thus a high-performance resonator element is obtained.

When a length of each of the grooves 55, 56, 65, and 66 along the Y-axis direction is set to Ld and a length of each of the electrode-formed regions 551, 561, 651, and 661 (hereinafter, also referred to as "electrode-formed region 551 and the like") along the Y-axis direction (hereinafter, also referred to as "length of each of the electrode-formed regions 551 and the like") is set to L1, the relations of Ld=900 (μm) and L1=700 (μm) are established in this embodiment.

Although a ratio of the electrode-formed region L1 with respect to the length Ld of the groove is set to 77.8%, the ratio is preferably equal to or greater than 72.8% and equal to or less than 82.8% in consideration of ±5% as an allowable variation, and is more preferably equal to or greater than 74.8% and equal to or less than 81.8%. Thus, it is possible to efficiently decrease a CI value while reducing an equivalent series capacitance C1.

In addition, it is preferable that ends of the non-electrode-formed regions 552 and 562 on the base portion 4 side are positioned between the weight portion 59 and a node of a harmonic vibration of the vibrating arm 5. Similarly, it is preferable that ends of the non-electrode-formed regions 652 and 662 on the base portion 4 side are positioned between the weight portion 69 and a node of a harmonic vibration of the vibrating arm 6. Thus, it is possible to efficiently suppress the generation of a vibration in a high-order mode.

In addition, when a distance between the ends of the vibrating arms 5 and 6 on the opposite side to the base portion 4 and the end of the base portion 4 on the opposite side to the vibrating arms 5 and 6 (that is, the entire length of the resonator element 2 along the Y-axis direction) is set to La and a distance between the centroid of a structure (that is, the quartz crystal substrate 3) which is constituted by the pair of vibrating arms 5 and 6 and the base portion 4 and the end of the base portion 4 on the opposite side to the vibrating arms 5 and 6 is set to Lg, it is preferable that Lg/La is equal to or less than $2/3$. Thus, when the resonator element 2 is fixed to the package 9 using an adhesive or the like, the fixation is facilitated.

In addition, from the viewpoint of increasing the conductivity of the driving electrodes 84 and 85 and adhesiveness with respect to the quartz crystal substrate 3, it is preferable that each of the driving electrodes 84 and 85 includes a base layer and a covering layer which is laminated on the base layer on the opposite side to the vibrating arms 5 and 6. In this case, when a thickness of the base layer is set to Tb and a thickness of the covering layer is set to Tc, it is preferable that the relation of $Tb/Tc \leq 4/7$ is satisfied. Thus, even when the base layer has a phase transition point on the low-temperature side in an operation temperature range, it is possible to decrease a CI value on the low-temperature side in the operation temperature range.

From the viewpoint of securing the conductivity and corrosion resistance of the driving electrodes 84 and 85, it is preferable to use a metal having excellent conductivity and corrosion resistance, for example, gold as a material of the covering layer. On the other hand, from the viewpoint of increasing adhesiveness between the covering layer and the quartz crystal substrate 3, it is preferable to use, for example, chromium as a material of the base layer.

When the base layer is formed of chromium, the thickness of the base layer is preferably equal to or greater than 50 Å and equal to or less than 700 Å. In spite of having an excellent function as a base layer, chromium has a phase transition point at a relatively low temperature. Consequently, the thickness of the base layer formed of chromium is reduced to approximately equal to or greater than 50 Å and equal to or less than 700 Å. Thus, it is possible to suppress an increase in a CI value due to a phase transition of chromium of the base layer in a low temperature region, while achieving a function as the base layer.

In addition, when a fundamental wave Q value is set to Q1, a harmonic Q value is set to Q2, a crystal impedance of a fundamental wave is set to R1, and a crystal impedance of a harmonic is set to R2, it is preferable to satisfy the relation of Q1<Q2 and the relation of R1<R2. Thus, it is possible to efficiently reduce a vibration in a high-order mode.

Package

The package 9 shown in FIGS. 1 and 2 includes a box-shaped base 91 having a concave portion 911, which is opened on the top surface, and a plate-shaped lid 92 bonded to the base 91 so as to close the opening of the concave portion 911. The package 9 has an accommodation space formed by closing the concave portion 911 with the lid 92, and the resonator element 2 is accommodated in the accommodation space in an airtight manner. In addition, the concave portion 911 is provided with a stepped portion 912, and the resonator element 2 is fixed to the stepped portion 912 through a conductive adhesive 11, which is formed by mixing a conductive filler into an epoxy-based or acrylic-based resin, for example, in the second base portion 42 of the base portion 4.

Meanwhile, the accommodation space may be in a decompressed (preferably, vacuum) state, or inert gas, such as nitrogen, helium, and argon, may fill the accommodation space. Thus, the vibration characteristics of the resonator element 2 are improved.

Materials of the base 91 are not particularly limited and various ceramics, such as aluminum oxide, can be used. In addition, although materials of the lid 92 are not particularly limited, it is preferable to use a member having a linear expansion coefficient similar to that of the material of the base 91. For example, when the above-described ceramic is used as a material of the base 91, it is preferable to use an alloy, such as Kovar. Meanwhile, bonding of the base 91 and the lid 92 is not particularly limited. For example, the base 91 and the lid 92 may be bonded to each other through an adhesive or may be bonded to each other by seam welding or the like.

In addition, connecting terminals 951 and 961 are formed in the stepped portion 912 of the base 91. Although not shown in the drawing, the first driving electrodes 84 of the resonator element 2 are drawn up to the second base portion 42 of the base portion 4, and are electrically connected to the connecting terminal 951 through the conductive adhesive 11 in the corresponding portion. Similarly, although not shown in the drawing, the second driving electrodes 85 of the resonator element 2 are drawn up to the second base portion 42 of the base portion 4, and are electrically connected to the connecting terminal 961 through the conductive adhesive 11 in the corresponding portion.

In addition, the connecting terminal 951 is electrically connected to an external terminal (not shown), which is formed on the bottom surface of the base 91, through a through electrode (not shown) passing through the base 91. The connecting terminal 961 is electrically connected to an external terminal (not shown), which is formed on the bottom surface of the base 91, through a through electrode (not shown) passing through the base 91.

Materials of the connecting terminals 951 and 961, the through electrode, and the external terminals are not particularly limited as long as the materials have conductivity. For example, the terminals and the electrode can be formed of a metal coating that is formed by laminating a coat, such as nickel (Ni), gold (Au), silver (Ag), or copper (Cu), on a metallization layer (base layer), such as chromium (Cr) or tungsten (W).

According to the resonator element 2 described above, the distal ends of the vibrating arms 5 and 6 are provided with the weight portions 59 and 69. Thus, it is possible to increase the strength of the vibrating arms 5 and 6 by increasing the widths of the arm portions 50 and 60 of the vibrating arms 5 and 6 without increasing the lengths of the vibrating arms 5 and 6, and to increase a Q value by reducing thermoelastic loss. As a result, it is possible to increase impact resistance while achieving a reduction in size, and to decrease a crystal impedance (CI) value.

In particular, since $\eta$ is optimized, it is possible to efficiently increase the strength of the vibrating arms 5 and 6 and a Q value.

Thus, in the resonator element 2, it is possible to increase impact resistance while achieving a reduction in size, and to realize a CI value which is smaller than 50 k$\Omega$.

In addition, the resonator 1 including such a resonator element 2 has an excellent reliability.

2. Oscillator

Subsequently, an oscillator to which the resonator element according to the invention (oscillator of the invention) is applied will be described.

Figure 12:
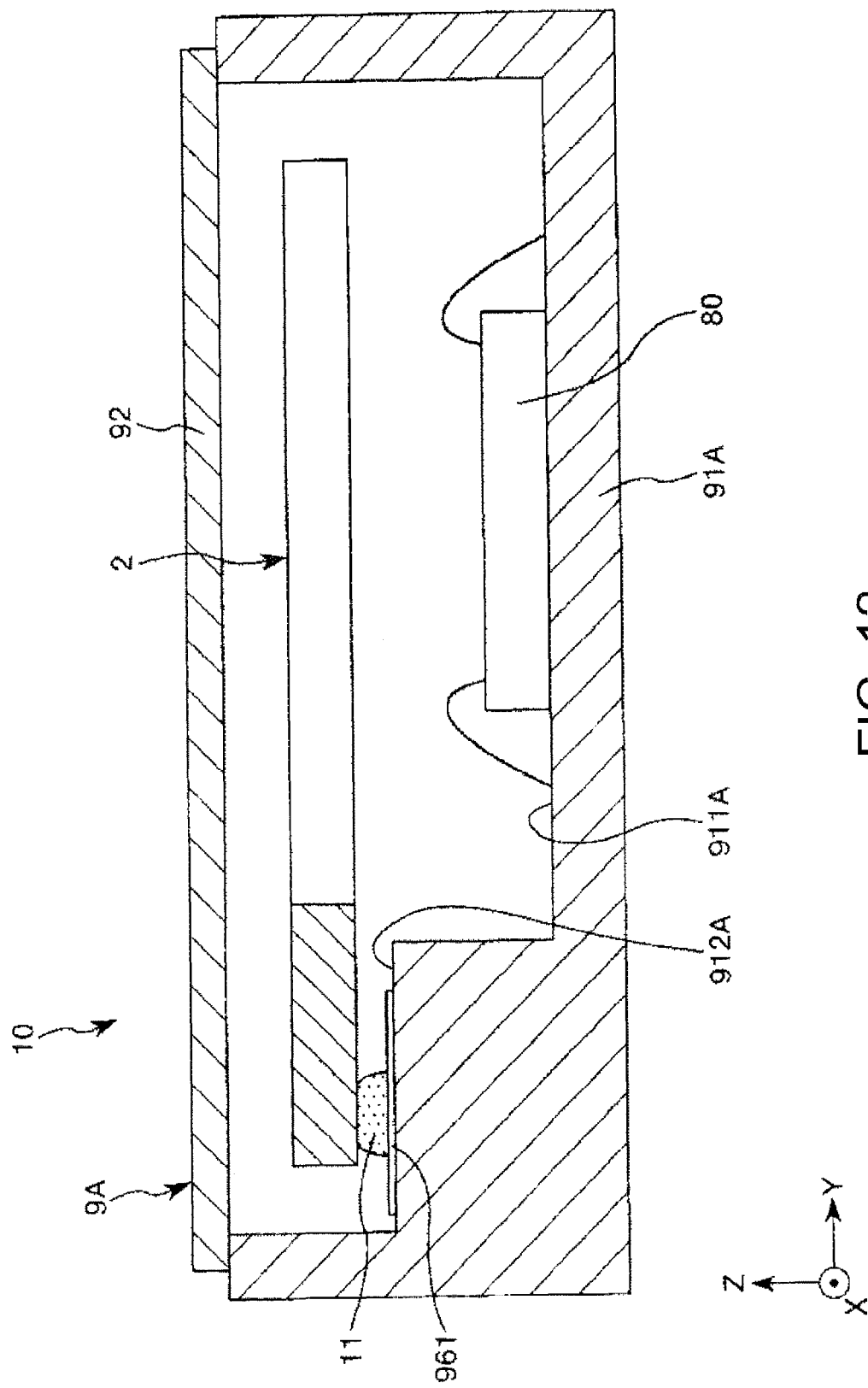
FIG. 12 is a cross-sectional view showing an example of an oscillator according to the invention.

FIG. 12 is a cross-sectional view showing an example of the oscillator according to the invention.

An oscillator 10 shown in FIG. 12 includes the resonator element 2 and an IC chip (chip component) 80 for driving the resonator element 2. Hereinafter, the oscillator 10 will be described focusing on the differences from the resonator described above, and a description of the same matters will be omitted.

A package 9A includes a box-shaped base 91A having a concave portion 911A, and a plate-shaped lid 92 that closes the opening of the concave portion 911A.

The concave portion 911A of the base 91A is provided with a stepped portion 912A.

A connecting terminal (not shown) is formed in the stepped portion 912A. In addition, the IC chip 80 is disposed on the bottom surface of the concave portion 911A (surface on the bottom side with respect to the stepped portion 912A). The IC chip 80 includes a driving circuit (oscillation circuit) for controlling the driving of the resonator element 2. When the resonator element 2 is driven by the IC chip 80, it is possible to extract a signal having a predetermined frequency.

In addition, a plurality of internal terminals (not shown) electrically connected to the IC chip 80 through a wire are formed on the bottom surface of the concave portion 911A. The plurality of internal terminals include terminals electrically connected to an external terminal (not shown), which is formed on the bottom surface of the package 9A, through a via hole which is not shown in the drawing and is formed in the base 91A, and terminals electrically connected to a connecting terminal (not shown) through a via hole and a wire which are not shown in the drawing.

Meanwhile, in FIG. 12, the configuration in which the IC chip 80 is disposed within an accommodation space has been described, but the arrangement of the IC chip 80 is not particularly limited. For example, the IC chip may be disposed on the outer side of the package 9A (on the bottom surface of the base).

According to such an oscillator 10, it is possible to exhibit an excellent reliability.

3. Electronic Device

Subsequently, an electronic device to which the resonator element according to the invention is applied (electronic device according to the invention) will be described in detail with reference to FIGS. 13 to 15.

Figure 13:
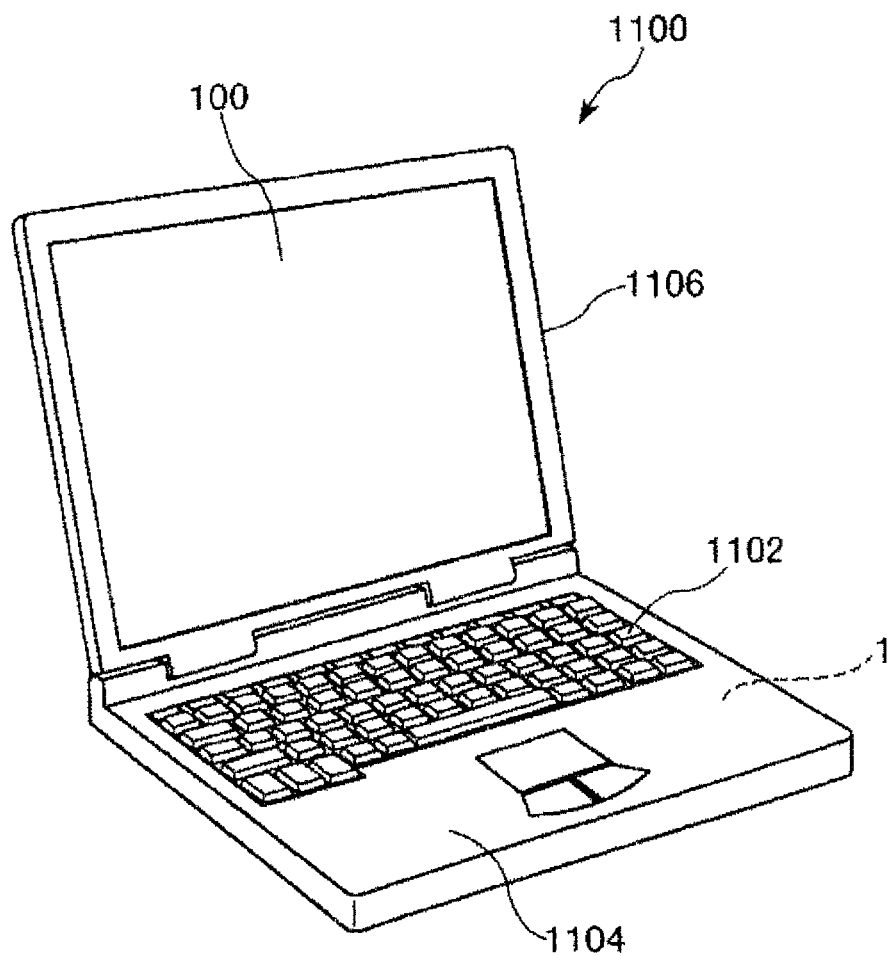
FIG. 13 is a perspective view showing a configuration of a mobile (or notebook) personal computer to which an electronic device including the resonator element according to the invention is applied.

FIG. 13 is a perspective view showing a configuration of a mobile (or notebook) personal computer to which an electronic device including the resonator element according to the invention is applied. In FIG. 13, a personal computer 1100 is configured to include a main body 1104 having a keyboard 1102 and a display unit 1106 having a display portion 100, and the display unit 1106 is supported so as to be rotatable with respect to the main body 1104 through a hinge structure. The resonator 1 that functions as a filter, a resonator, a reference clock, and the like is built into the personal computer 1100.

Figure 14:
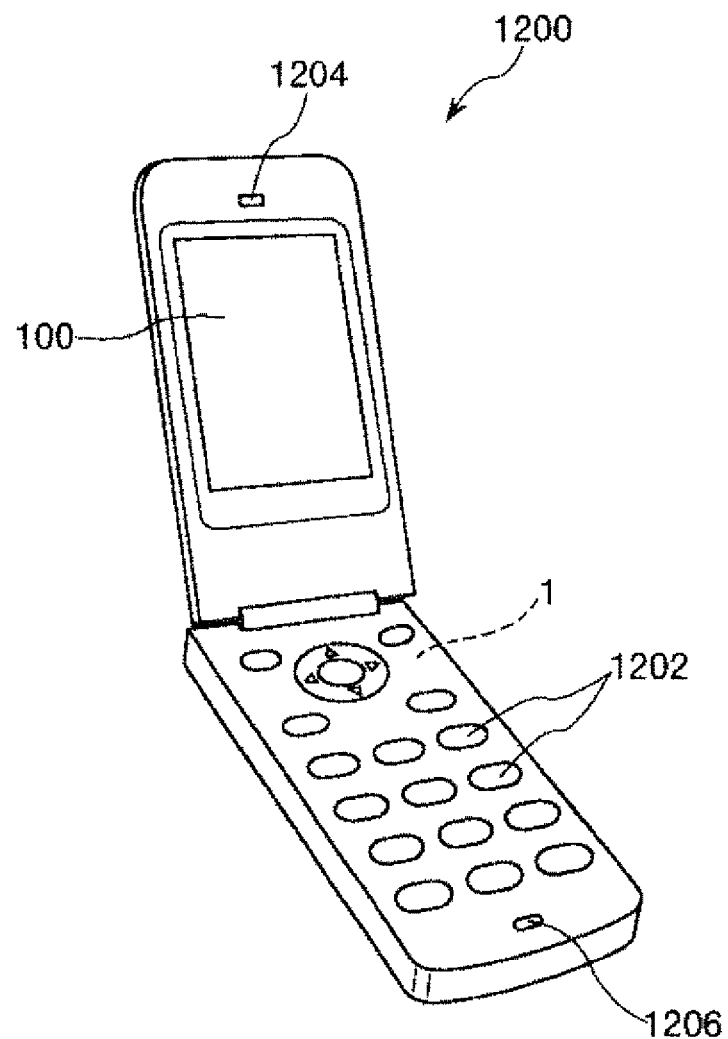
FIG. 14 is a perspective view showing a configuration of a mobile phone (PHS is also included) to which an electronic device including the resonator element according to the invention is applied.

FIG. 14 is a perspective view showing a configuration of a mobile phone (PHS is also included) to which an electronic device including the resonator element according to the invention is applied. In FIG. 14, a mobile phone 1200 includes a plurality of operation buttons 1202, an earpiece 1204, and a mouthpiece 1206, and a display portion 100 is disposed between the operation buttons 1202 and the earpiece 1204. The resonator 1 that functions as a filter, a resonator, and the like is built into the mobile phone 1200.

Figure 15:
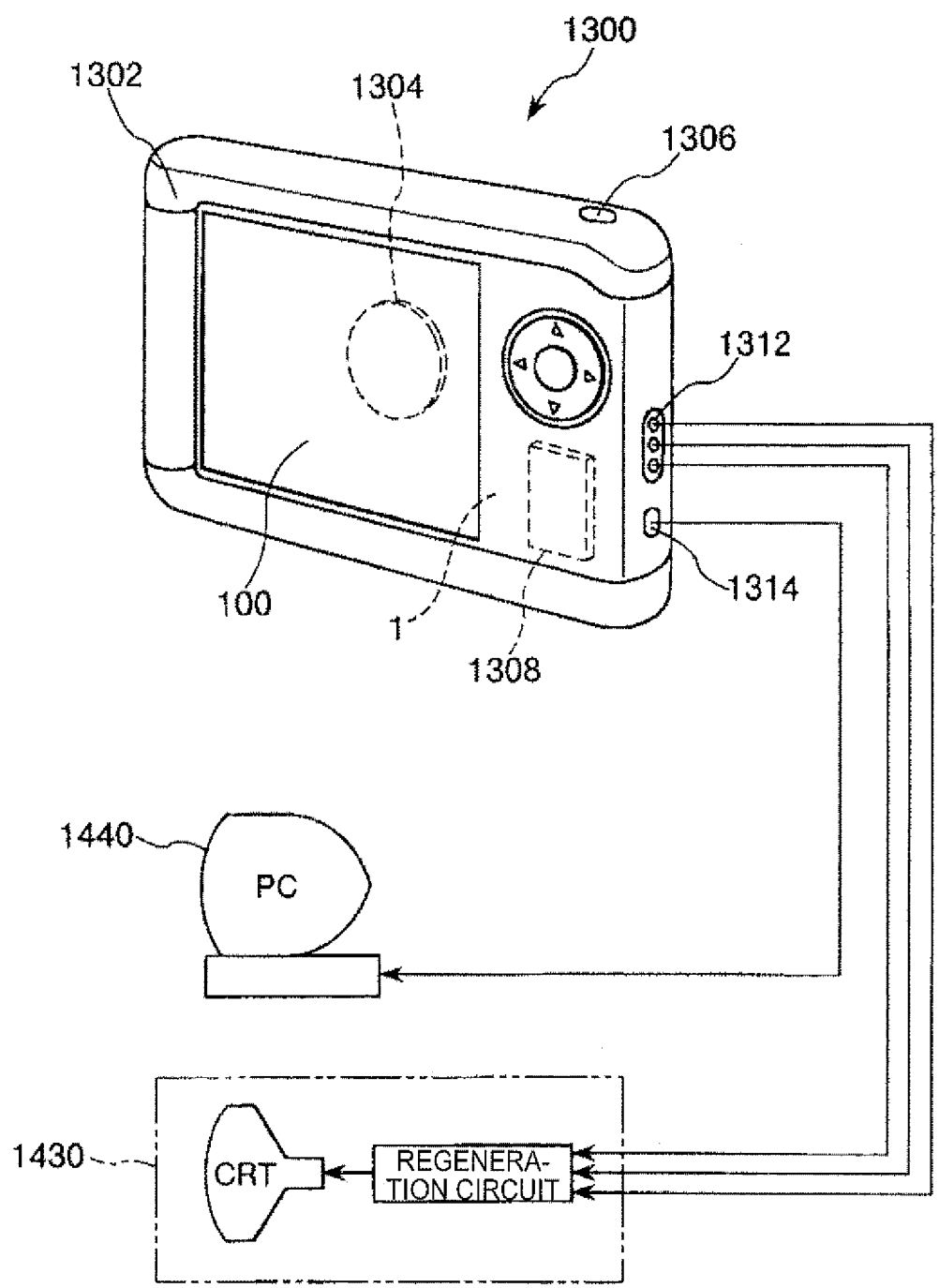
FIG. 15 is a perspective view showing a configuration of a digital still camera to which an electronic device including the resonator element according to the invention is applied.

FIG. 15 is a perspective view showing a configuration of a digital still camera to which an electronic device including the resonator element according to the invention is applied. Meanwhile, connection with an external device is simply shown in FIG. 15. Here, a silver halide photography film is exposed to light according to an optical image of a subject in a typical camera, while the digital still camera 1300 generates an imaging signal (image signal) by performing photoelectric conversion of an optical image of a subject using an imaging element, such as a charge coupled device (CCD).

A display portion is provided on the back of a case (body) 1302 in the digital still camera 1300, so that display based on the imaging signal of the CCD is performed. The display portion functions as a viewfinder that displays a subject as an electronic image. In addition, a light receiving unit 1304 including an optical lens (imaging optical system), a CCD, and the like is provided on the front side (back side in FIG. 15) of the case 1302.

When a photographer checks a subject image displayed on the display portion and presses a shutter button 1306, an imaging signal of the CCD at that point in time is transferred and stored in a memory 1308. In addition, in the digital still camera 1300, a video signal output terminal 1312 and an input/output terminal for data communication 1314 are provided on the side surface of the case 1302. In addition, as shown in FIG. 15, a television monitor 1430 is connected to the video signal output terminal 1312 and a personal computer 1440 is connected to the input/output terminal for data communication 1314 when necessary. Further, an imaging signal stored in the memory 1308 may be output to the television monitor 1430 or the personal computer 1440 by a predetermined operation. The resonator 1 that functions as a filter, a resonator, and the like is built into the digital still camera 1300.

Meanwhile, the electronic device including the resonator element according to the invention can be applied not only to the personal computer (mobile personal computer) shown in FIG. 13, the mobile phone shown in FIG. 14, and the digital still camera shown in FIG. 15 but also to an ink jet type discharge apparatus (for example, an ink jet printer), a laptop type personal computer, a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), and a flight simulator.

4. Moving Object

Figure 16:
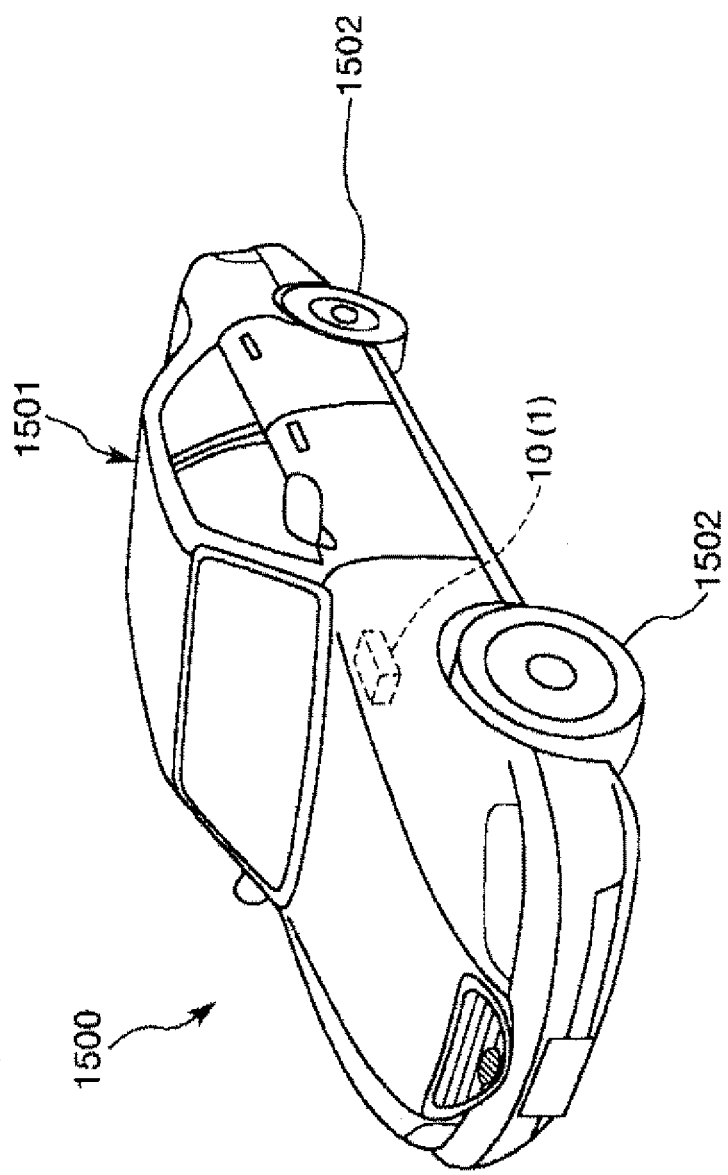
FIG. 16 is a perspective view showing a configuration of a moving object (vehicle) to which an electronic device including the resonator element according to the invention is applied.
Figure 17:
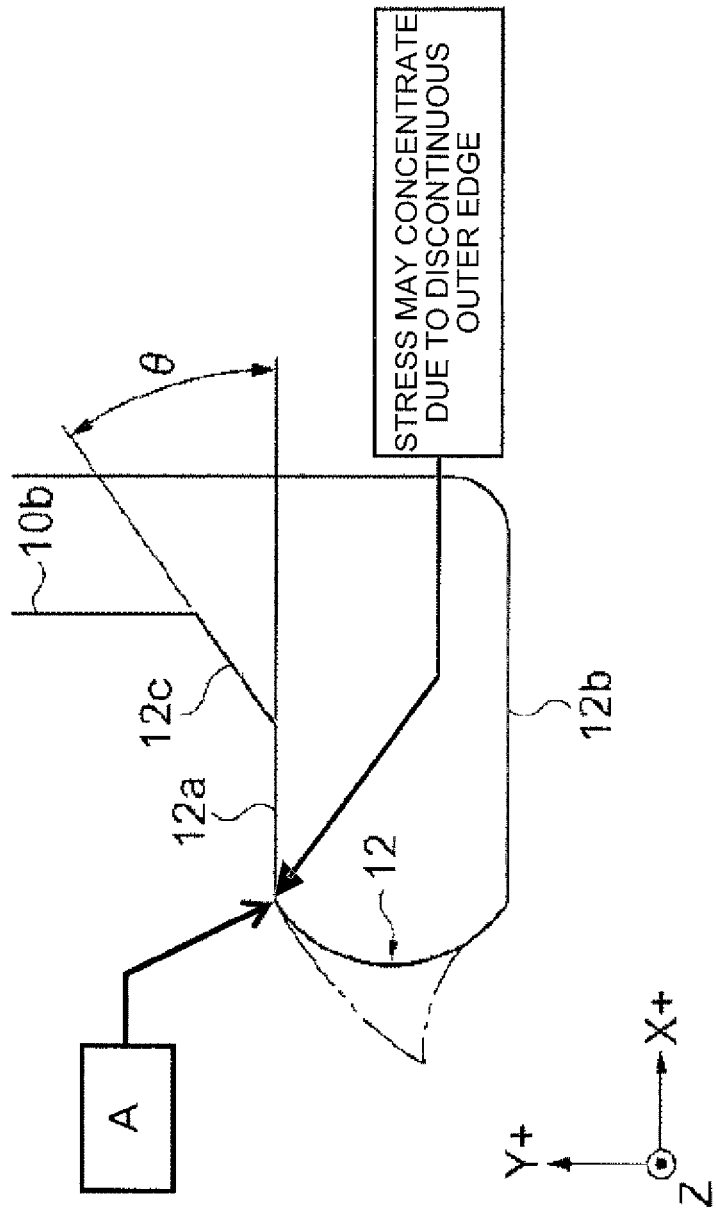
FIG. 17 is a diagram illustrating a base portion of a vibrating arm of the related art.

Subsequently, a moving object to which the resonator element according to the invention is applied will be described in detail with reference to FIG. 16. FIG. 16 is a perspective view showing a configuration of a moving object (vehicle) to which an electronic device including the resonator element according to the invention is applied. In FIG. 16, a moving object 1500 includes a car body 1501 and four wheels 1502, and is configured to rotate the wheels 1502 using a power source (engine), not shown in the drawing, which is provided in the car body 1501. The oscillator 10 (resonator element 2) is built into the moving object 1500.

According to such an electronic device, it is possible to exhibit an excellent reliability.

Meanwhile, the moving object including the resonator element according to the invention is not limited to a vehicle, and can also be applied to, for example, other vehicles such as a motorcycle or a railroad car, an aircraft, a ship, a spacecraft, and the like.

While the resonator element, the resonator, the oscillator, the electronic device, and the moving object according to the invention have been described with reference to the embodiments shown in the drawings, the invention is not limited thereto, and the configuration of each portion may be replaced with an arbitrary configuration having the same function. In addition, other arbitrary structures may be added to the invention. In addition, the embodiments may be appropriately combined.

In addition, the resonator element is not limited to the oscillator, and can also be applied to, for example, a sensor such as a gyro sensor.

What is claimed is:

1. A resonator element comprising:
   a base portion; and
   a pair of vibrating arms that extend from one end of the base portion along a first direction and are arranged in a line extending in a second direction perpendicular to the first direction,
   the base portion including,
   a first base portion that includes the one end,
   a second base portion that is provided on an opposite side of the first base portion from the one end side when seen in a plan view, and
   a connecting portion that connects the first base portion and the second base portion,
   the base portion being provided with a notch portion that is aligned with the connecting portion along the second direction, the notch portion having a width which increases along the first direction,
   in a principal surface of the base portion, the notch portion is provided with (i) one end-side outer edge on the one end-side, and (ii) the other end-side outer edge on the other end side, which is the opposite side to the one end-side, and the one end-side outer edge and the other end-side outer edge are asymmetrical to each other,
   the one end-side outer edge is a line, which includes a straight line and a curved line and does not include a corner portion, and
   when an angle between the straight line of the one end-side of the outer edge and a virtual line passing through the notch portion along the second direction is $\theta$, a relation of $0° < \theta < 90°$ is satisfied.

2. The resonator element according to claim 1, wherein a relation of $6° \leq \theta \leq 70°$ is satisfied.

3. The resonator element according to claim 1, wherein when a width of the first base portion along the second direction is set to S1 and a minimum width of the connecting portion along the second direction is set to S2, S2/S1 is equal to or greater than 0.3 and equal to or less than 0.6.

4. The resonator element according to claim 1, wherein the vibrating arm includes a weight portion and an arm portion which is disposed between the base portion and the weight portion, when seen in a plan view.

5. The resonator element according to claim 4, wherein the weight portion has a width along the second direction which is larger than a width of the arm portion.

6. The resonator element according to claim 5, wherein when the width of the arm portion along the second direction is set to W1 and the width of the weight portion along the second direction is set to W2, W2/W1 is equal to or greater than 1.43 and equal to or less than 1.79.

7. The resonator element according to claim 1, wherein a groove is provided along the first direction in at least one principal surface of a first principal surface and a second principal surface of the vibrating arm which serve as front and back sides, respectively.

8. The resonator element according to claim 7, wherein in the principal surface provided with the groove, when a width of the arm portion along the second direction is set to W1, a width, along the second direction, of a portion interposed between a side surface, which connects the first principal surface and the second principal surface, and an outer edge of the groove lined up with the side surface along the second direction is set to W3, and 2×W3/W1 is set to η, a relation of 20%≤η≤50% is satisfied.

9. The resonator element according to claim 8, wherein a relation of 30%≤η≤40% is satisfied.

10. The resonator element according to claim 1, wherein a thickness of the arm portion is equal to or greater than 115 μm and equal to or less than 150 μm.

11. The resonator element according to claim 1, further comprising an excitation electrode provided in the vibrating arm,
wherein the excitation electrode includes a base layer and a covering layer which is laminated on the base layer on an opposite side to the vibrating arm, and
wherein when a thickness of the base layer is set to Tb and a thickness of the covering layer is set to Tc, a relation of Tb/Tc≤4/7 is satisfied.

12. The resonator element according to claim 11, wherein the base layer is formed of chromium, and a thickness of the base layer is equal to or greater than 50 Å and equal to or less than 700 Å.

13. A resonator comprising:
the resonator element according to claim 1; and
a package that accommodates the resonator element.

14. A resonator comprising:
the resonator element according to claim 2; and
a package that accommodates the resonator element.

15. An oscillator comprising:
the resonator element according to claim 1; and
a circuit.

16. An oscillator comprising:
the resonator element according to claim 2; and
a circuit.

17. An electronic device comprising the resonator element according to claim 2.

18. A moving object comprising the resonator element according to claim 1.

19. A moving object comprising the resonator element according to claim 2.

20. An electronic device comprising the vibrator element according to claim 1.

21. A resonator element comprising:
a base portion including a first base portion and a second base portion;
a pair of vibrating arms that extend from one end of the base portion along a first direction and are arranged in a line extending in a second direction perpendicular to the first direction; and
a connecting portion that connects the first base portion and the second base portion, the connecting portion being a notch portion having a varying width that increases as the notch portion approaches the base portion, and the connecting portion having an outer edge having no corners, and
an outer edge of the notch portion including one end-side outer edge and the other end-side outer edge, the one end-side outer edge including an inclined portion and a curved portion, the one end-side outer edge does not include a corner portion, the inclined portion forming an acute angle with respect to the second direction, and the one end-side outer edge and the other end-side outer edge are asymmetrical to each other.

* * * * *